(12) United States Patent
Lin et al.

(10) Patent No.: US 10,269,587 B2
(45) Date of Patent: Apr. 23, 2019

(54) INTEGRATED CIRCUIT PACKAGES AND METHODS OF FORMING SAME

(71) Applicant: Taiwan Semiconductor Manufacturing Company, Ltd., Hsinchu (TW)

(72) Inventors: Jing-Cheng Lin, Hsinchu (TW); Li-Hui Cheng, New Taipei (TW); Po-Hao Tsai, Zhongli (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/722,655

(22) Filed: Oct. 2, 2017

(65) Prior Publication Data

US 2019/0006194 A1 Jan. 3, 2019

Related U.S. Application Data

(60) Provisional application No. 62/527,506, filed on Jun. 30, 2017.

(51) Int. Cl.
*H01L 23/58* (2006.01)
*H01L 21/56* (2006.01)
(Continued)

(52) U.S. Cl.
CPC ............ *H01L 21/56* (2013.01); *H01L 21/486* (2013.01); *H01L 21/78* (2013.01); *H01L 22/14* (2013.01);
(Continued)

(58) Field of Classification Search
CPC ....... H01L 2924/00; H01L 2924/00014; H01L 2224/48227; H01L 2224/73265;
(Continued)

(56) References Cited

U.S. PATENT DOCUMENTS 6,578,755 B1 6/2003 Elenius et al.
8,765,512 B2 7/2014 Kohl et al.
(Continued)

FOREIGN PATENT DOCUMENTS

CN 103137583 A 6/2013
CN 103972191 A 8/2014
(Continued)

*Primary Examiner* — Robert G Bachner
(74) *Attorney, Agent, or Firm* — Slater Matsil, LLP

(57) ABSTRACT

An integrated circuit package and a method of forming the same are provided. A method includes forming a conductive column over a carrier. An integrated circuit die is attached to the carrier, the integrated circuit die being disposed adjacent the conductive column. An encapsulant is formed around the conductive column and the integrated circuit die. The carrier is removed to expose a first surface of the conductive column and a second surface of the encapsulant. A polymer material is formed over the first surface and the second surface. The polymer material is cured to form an annular-shaped structure. An inner edge of the annular-shaped structure overlaps the first surface in a plan view. An outer edge of the annular-shaped structure overlaps the second surface in the plan view.

20 Claims, 33 Drawing Sheets

(51) Int. Cl.
*H01L 21/66* (2006.01)
*H01L 23/00* (2006.01)
*H01L 25/065* (2006.01)
*H01L 23/31* (2006.01)
*H01L 21/48* (2006.01)
*H01L 21/78* (2006.01)

(52) U.S. Cl.
CPC .............. *H01L 22/20* (2013.01); *H01L 22/32* (2013.01); *H01L 23/3114* (2013.01); *H01L 23/3128* (2013.01); *H01L 24/03* (2013.01); *H01L 24/19* (2013.01); *H01L 24/20* (2013.01); *H01L 24/97* (2013.01); *H01L 25/0657* (2013.01)

(58) Field of Classification Search
CPC ....... H01L 2224/97; H01L 2224/32225; H01L 2924/00012; H01L 2924/181; H01L 2224/32145; H01L 2924/15311; H01L 2924/12042; H01L 2224/48091; H01L 2224/73204; H01L 2224/83; H01L 2924/014; B23K 1/0016; B23K 1/0053; B23K 1/0056; B23K 1/012; B23K 1/018; B23K 1/203; B23K 2101/42; B23K 3/029; B32B 2310/0825; B32B 2310/0831; B32B 2310/0843; B32B 2457/14; B32B 38/10; B32B 38/162; B32B 38/1858; B32B 43/006
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,461,018 B1 | 10/2016 | Tsai et al. |
| 9,496,189 B2 | 11/2016 | Yu et al. |
| 2013/0134559 A1 | 5/2013 | Lin et al. |
| 2013/0270685 A1 | 10/2013 | Yim et al. |
| 2014/0131858 A1 | 5/2014 | Pan et al. |
| 2016/0240480 A1 | 8/2016 | Lin et al. |
| 2016/0260695 A1 | 9/2016 | Chung et al. |
| 2017/0005052 A1* | 1/2017 | Chen ........................ H01L 24/13 |
| 2017/0141053 A1* | 5/2017 | Chen .................... H01L 23/5389 |
| 2017/0154811 A1 | 6/2017 | Wu et al. |
| 2017/0154862 A1 | 6/2017 | Chang et al. |
| 2017/0229432 A1 | 8/2017 | Lin et al. |

FOREIGN PATENT DOCUMENTS

| | | |
|---|---|---|
| CN | 105590914 A | 5/2016 |
| CN | 106816390 A | 6/2017 |
| JP | 2000306949 A | 11/2000 |
| KR | 20030060897 A | 7/2003 |
| KR | 20140126696 A | 10/2014 |
| KR | 20160100196 A | 8/2016 |
| KR | 20160123964 A | 10/2016 |
| TW | 201642360 A | 12/2016 |

\* cited by examiner

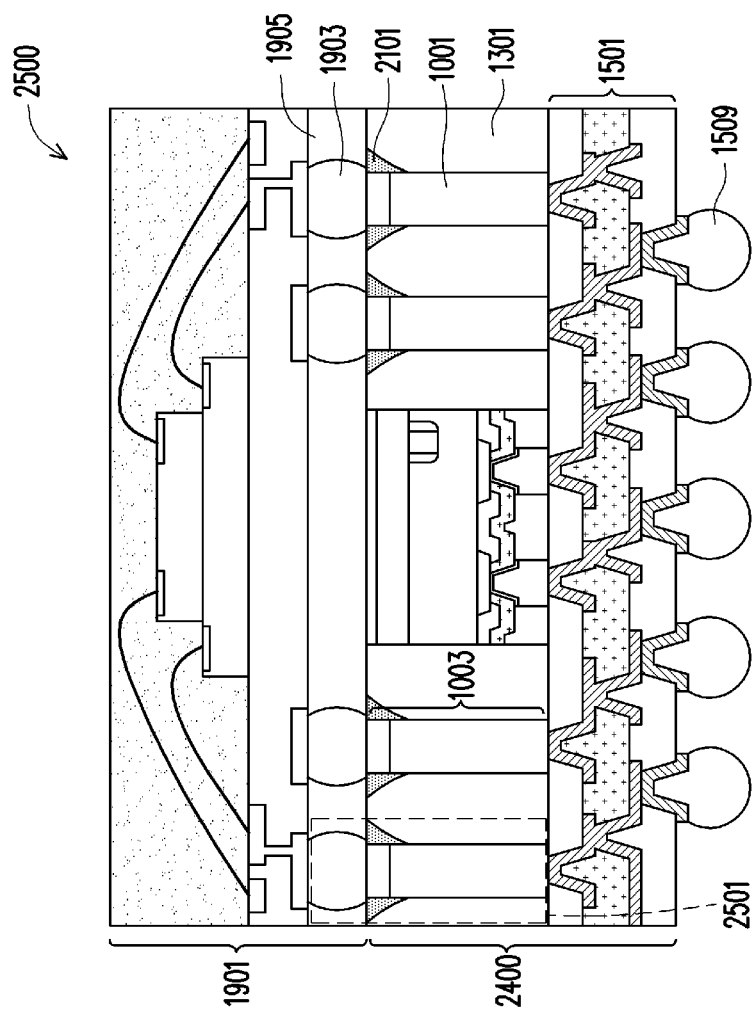

INTEGRATED CIRCUIT PACKAGES AND METHODS OF FORMING SAME

PRIORITY CLAIM AND CROSS-REFERENCE

This application claims the benefit of U.S. Provisional Application Ser. No. 62/527,506, filed on Jun. 30, 2017, entitled "Integrated Circuit Packages and Methods of Forming Same," which application is hereby incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21-24, 25A, 25B and 26 are cross-sectional views of various processing steps during fabrication of integrated circuit packages in accordance with some embodiments.

DETAILED DESCRIPTION

Figure 1:
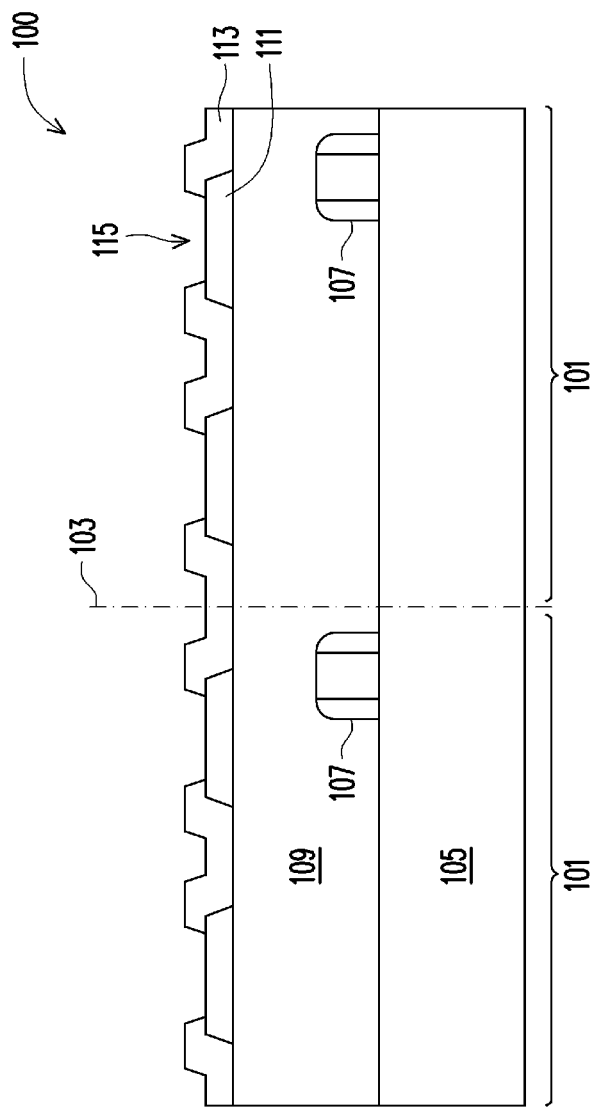
FIGS. 1-8 are cross-sectional views of various processing steps during fabrication of integrated circuit dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely an integrated circuit package such as an integrated fan-out (InFO) package and a PoP package comprising an InFO package. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, or the like, or mounting input components, boards, dies or other components, or for connection packaging or mounting combinations of any type of integrated circuits or electrical components.

Various embodiments described herein allow for forming protective rings around vias extending through an encapsulant (such as, for example, molding compound) of an InFO package. In some embodiments, the protective rings allow for improving a profile of connectors (such as, for example, solder bumps) attached to the vias. In some embodiments, the protective rings further allow for preventing or eliminating delamination of the encapsulant from the vias, delamination of an underfill from the connectors, formation of cracks in the encapsulant and/or the underfill, propagation of the cracks between the encapsulant and the underfill, and formation cracks in joints formed by the vias and corresponding connectors while performing a reliability test of an integrated circuit package and/or during the normal operation of the integrated circuit package. Various embodiments described herein further allow for reducing the number of manufacturing steps and the manufacturing cost for forming integrated circuit packages.

FIGS. 1-8 are cross-sectional views of various processing steps during fabrication of integrated circuit dies in accordance with some embodiments. Referring to FIG. 1, a portion of a workpiece 100 having die regions 101 separated by scribe lines 103 (also referred to as dicing lines or dicing streets) is illustrated. As described below in greater detail, the workpiece 100 will be diced along the scribe lines 103 to form individual integrated circuit dies (such as integrated circuit dies 801 illustrated in FIG. 8). In some embodiments, the workpiece 100 comprises a substrate 105, one or more active and/or passive devices 107 on the substrate 105, and one or more metallization layers 109 over the substrate 105.

In some embodiments, the substrate 105 may be formed of silicon, although it may also be formed of other group III, group IV, and/or group V elements, such as silicon, germanium, gallium, arsenic, and combinations thereof. The substrate 105 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In some embodiments, the one or more active and/or passive devices 107 may include various n-type metal-oxide semiconductor (NMOS) and/or p-type metal-oxide semiconductor (PMOS) devices such as transistors, capacitors, resistors, diodes, photo-diodes, fuses and/or the like.

The one or more metallization layers 109 may include an inter-layer dielectric (ILD)/inter-metal dielectric layers (IMDs) formed over the substrate 105. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, interconnect structures (not shown) may be formed in the ILD/IMDs using, for example, a damascene process, a dual damascene process, or the like. In some embodiments, interconnect structures may comprise copper, a copper alloy, silver, gold, tungsten, tantalum, aluminum, or the like. In some embodiments, the interconnect structures may provide electrical connections between the one or more active and/or passive devices 107 formed on the substrate 105.

In some embodiments, contact pads 111 are formed over the one or more metallization layers 109. The contact pads 111 may be electrically coupled to the one or more active and/or passive devices 107 through the one or more metallization layers 109. In some embodiments, the contact pads 111 may comprise a conductive material such as aluminum, copper, tungsten, silver, gold, a combination thereof, or the like. In some embodiments, a conductive material may be formed over the one or more metallization layers 109 using, for example, physical vapor deposition (PVD), atomic layer deposition (ALD), electro-chemical plating, electroless plating, a combination thereof, or the like. Subsequently, the conductive material is patterned to form the contact pads 111. In some embodiments, the conductive material may be patterned using suitable photolithography and etching techniques. Generally, photolithography techniques involve depositing a photoresist material (not shown), which is subsequently irradiated (exposed) and developed to remove a portion of the photoresist material. The remaining photoresist material protects the underlying material, such as the conductive material of the contact pads 111 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the contact pads 111. Subsequently, the photoresist material may be removed using, for example, an ashing process followed by a wet clean process.

Referring further to FIG. 1, a passivation layer 113 is formed over the substrate 105 and the contact pads 111. In some embodiments, the passivation layer 113 may comprise one or more layers of non-photo-patternable dielectric materials such as silicon nitride, silicon oxide, phosphosilicate glass (PSG), borosilicate glass (BSG), boron-doped phosphosilicate glass (BPSG), a combination thereof, or the like, and may be formed using chemical vapor deposition (CVD), PVD, ALD, a spin-on coating process, a combination thereof, or the like. In other embodiments, the passivation layer 113 may comprise one or more layers of photo-patternable insulating materials such as polybenzoxazole (PBO), polyimide (PI), benzocyclobutene (BCB), or the like, and may be formed using a spin-on coating process, or the like. Such photo-patternable dielectric materials may be patterned using similar photolithography methods as a photoresist material.

In some embodiments, the openings 115 are formed in the passivation layer 113 to expose portions of the contact pads 111. In some embodiments where the passivation layer 113 comprises a non-photo-patternable dielectric material, the passivation layer 113 may be patterned using suitable photolithography and etching methods. In some embodiments, a photoresist material (not shown) is formed over the passivation layer 113. The photoresist material is subsequently irradiated (exposed) and developed to remove a portion of the photoresist material. Subsequently, exposed portions of the passivation layer 113 are removed using, for example, a suitable etching process to form the openings 115.

Figure 2:
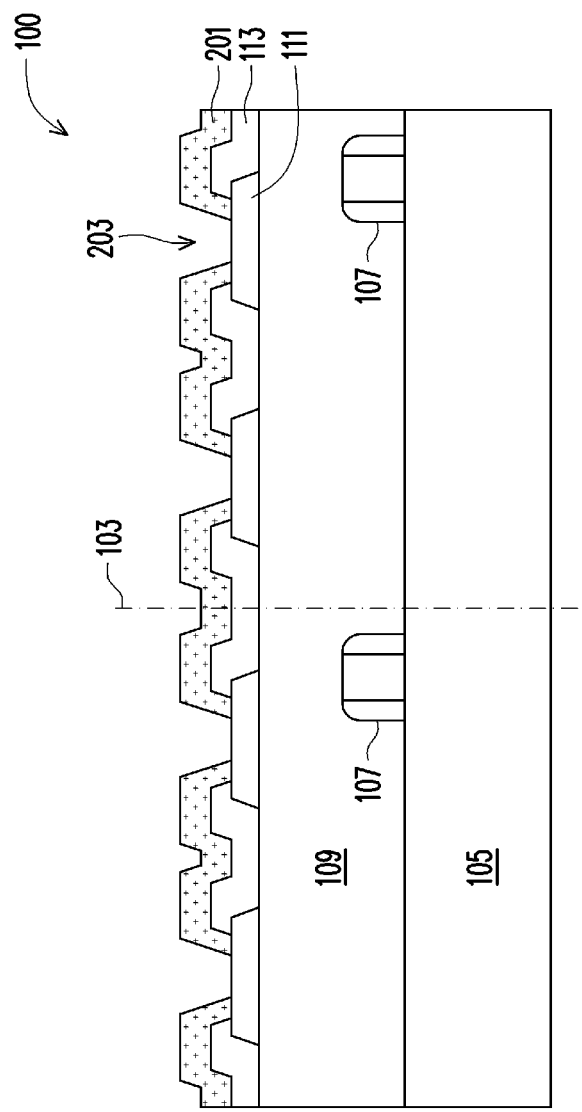

Referring to FIG. 2, a buffer layer 201 is formed over the passivation layer 113 and the contact pads 111. In some embodiments, the buffer layer 201 may comprise one or more layers of photo-patternable insulating materials such as polybenzoxazole (PBO), polyimide (PI), benzocyclobutene (BCB), a combination thereof, or the like, and may be formed using a spin-on coating process, or the like. In some embodiments, the buffer layer 201 is patterned to form openings 203 and expose the contact pads 111. In some embodiments, the openings 203 may be formed using suitable photolithography techniques to expose the buffer layer 201 to light. The buffer layer 201 is developed and/or cured after the exposure.

Figure 3:
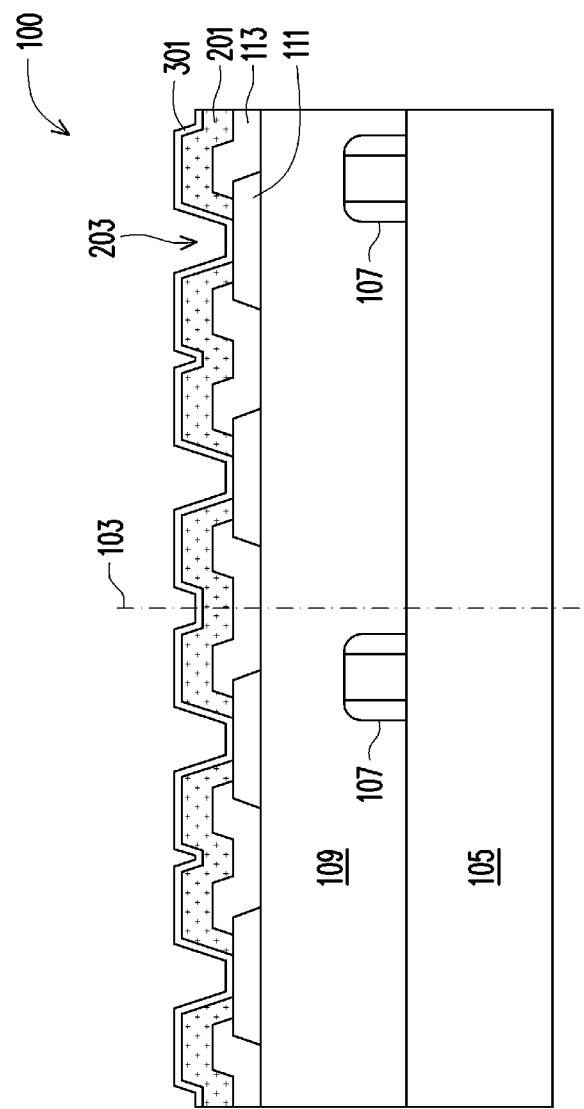

Referring to FIG. 3, a seed layer 301 is blanket deposited over the buffer layer 201 and the openings 203. The seed layer 301 may comprise one or more layers of copper, titanium, nickel, gold, manganese, a combination thereof, or the like, and may be formed by ALD, PVD, sputtering, a combination thereof, or the like. In some embodiments, the seed layer 301 comprises a layer of copper formed over a layer of titanium.

Figure 4:
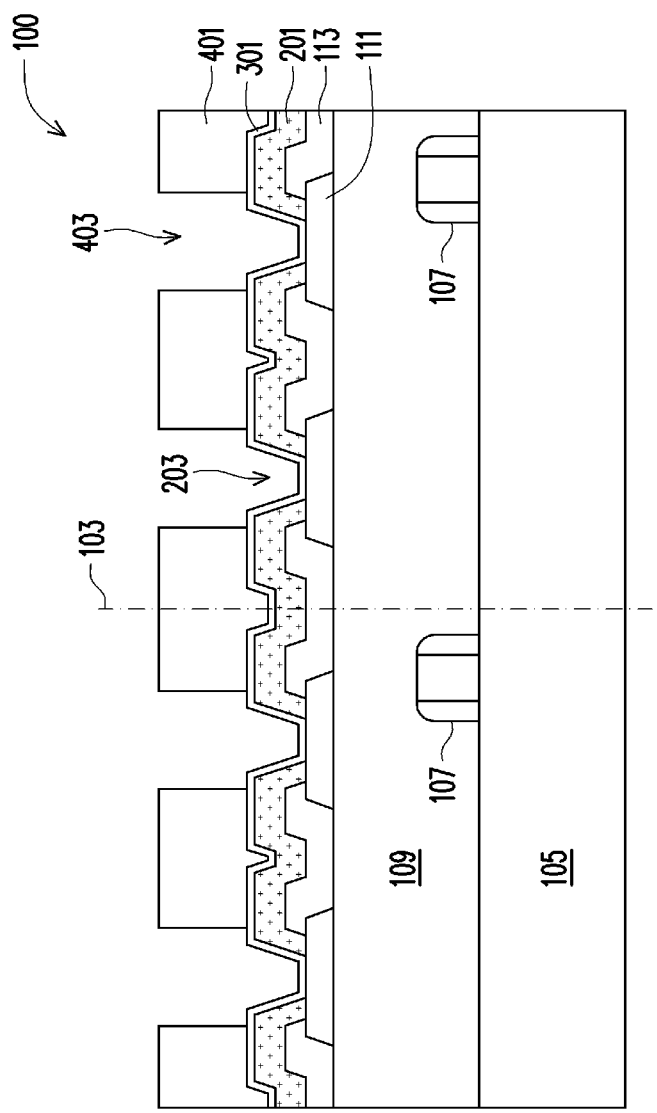

Referring to FIG. 4, a patterned mask 401 is formed over the seed layer 301. In some embodiments, the patterned mask 401 comprises a photoresist material, or any photo-patternable material. In some embodiments, a material of the patterned mask 401 is deposited, irradiated (exposed) and developed to remove portions of the material and form openings 403, thereby forming the patterned mask 401. In the illustrated embodiment, the openings 403 expose portions of the seed layer 301 formed over the contact pads 111 in the openings 203. As discussed in greater detail below, conductive pillars (such as conductive pillars 501 illustrated in FIG. 5) will be formed in the openings 403 to provide electrical connections to the contact pads 111.

Figure 5:
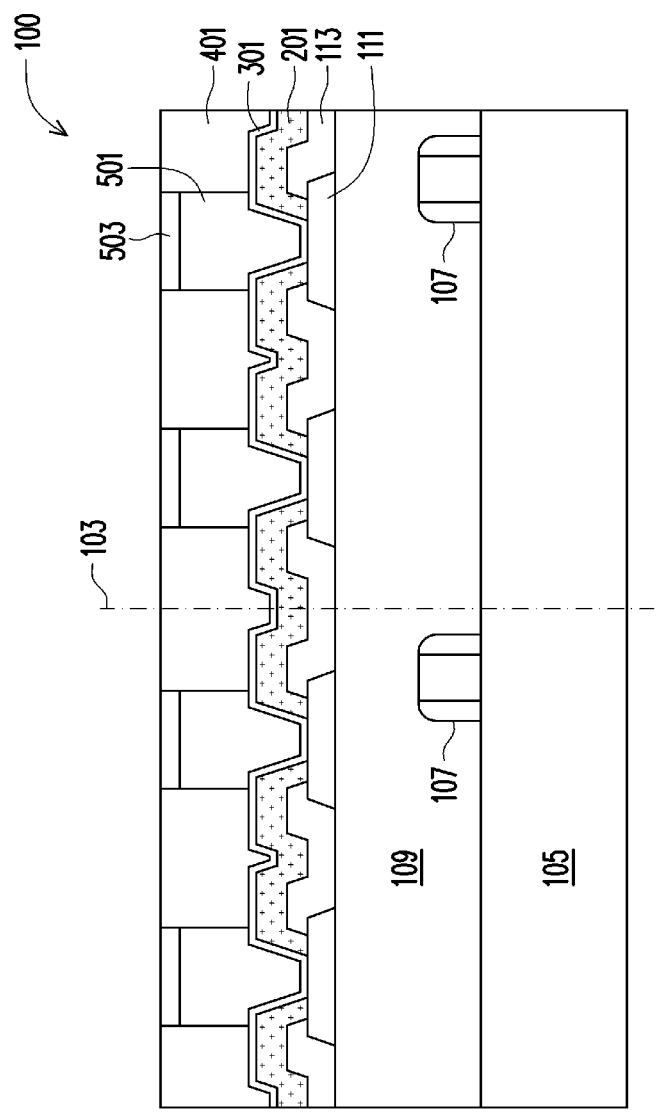

Referring to FIG. 5, conductive pillars 501 are formed in combined openings formed of the openings 403 and 203 (see FIG. 4). In some embodiments, the combined openings are filled with a conductive material such as copper, tungsten, aluminum, silver, gold, a combination thereof, or the like, using an electro-chemical plating process, an electroless plating process, ALD, PVD, a combination thereof, or the like to form the conductive pillars 501. In some embodiments, the conductive pillars 501 partially fill the combined openings and remaining portions of the combined openings are filled with a solder material to from solder layers 503 over the conductive pillars 501. In some embodiments, the solder materials may be lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu). In some embodiments, the solder layers 503 may be formed using evaporation, an electro-chemical plating process, an electroless plating process, printing, solder transfer, a combination thereof, or the like.

Figure 6:
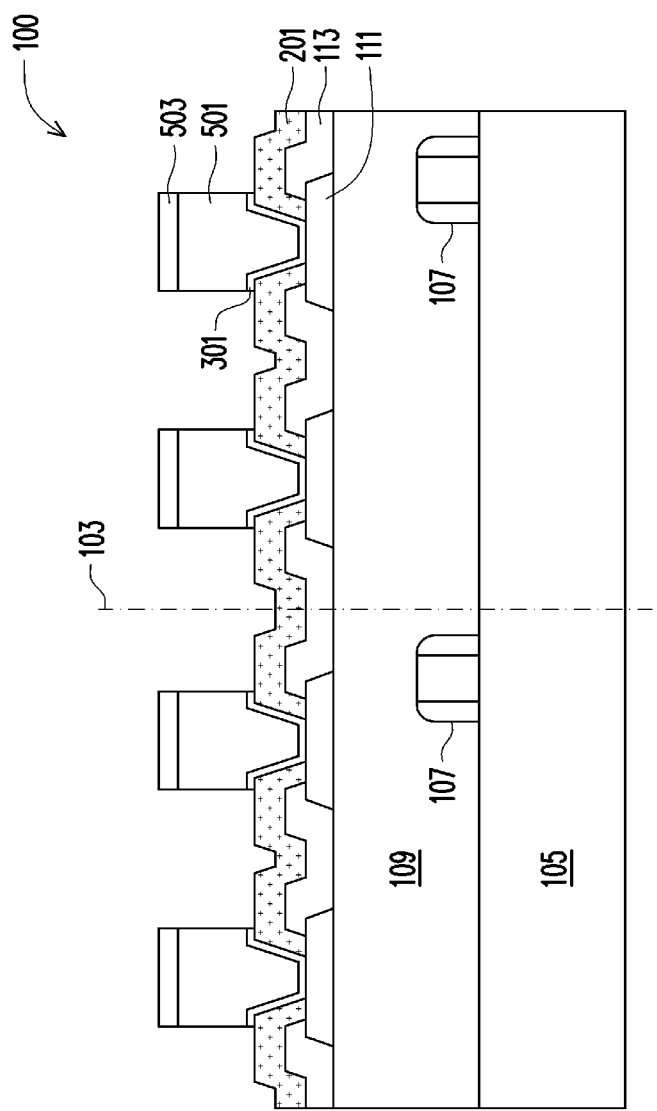

Referring to FIG. 6, after forming the conductive pillars 501 and the solder layers 503, the patterned mask 401 is removed. In some embodiments, the patterned mask 401 comprising a photoresist material may be removed using, for example, an ashing process followed by a wet clean process. Subsequently, exposed portions of the seed layer 301 are removed using, for example, a suitable etching process.

Figure 7:
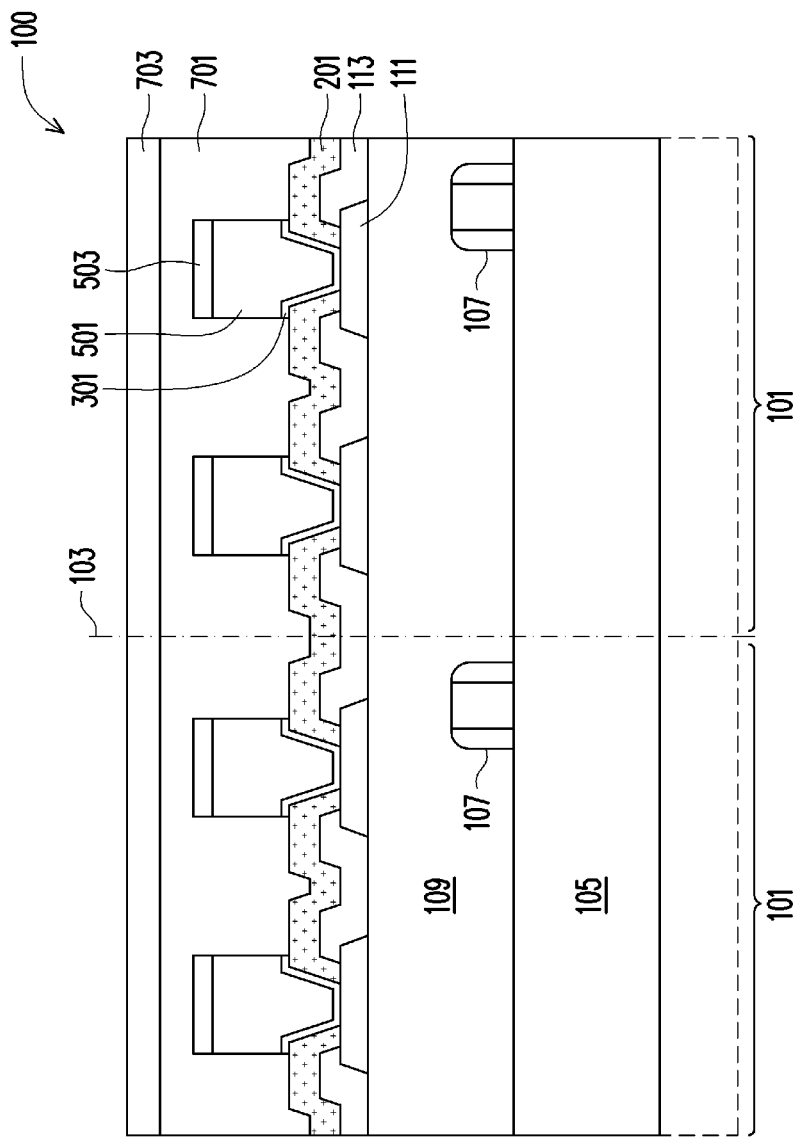

Referring to FIG. 7, a protective layer 701 is formed over and surrounding the conductive pillars 501 and corresponding solder layers 503. In some embodiments, the protective layer 701 may comprise one or more layers of photo-patternable insulating materials such as polybenzoxazole (PBO), polyimide (PI), benzocyclobutene (BCB), a combination thereof, or the like, and may be formed using a spin-on coating process, or the like. In some embodiments, before forming the protective layer 701, each of the die regions 101 may be tested to identify known good dies (KGDs) for further processing.

Referring further to FIG. 7, in some embodiments, it is desirable to back grind the substrate 105, for example, to reduce the thickness of the workpiece 100, and thicknesses of subsequently formed integrated circuit dies. In such embodiments, a thinning process is performed, where a tape 703 such as a back grinding (BG) tape is applied to a top surface of the protective layer 701, and the backside of the substrate 105 is thinned by grinding, etching, a CMP process, a combination thereof, or the like. In some embodiments, the tape 703 protects the workpiece 100 from contamination caused by grinding/etching fluids and/or debris.

Figure 8:
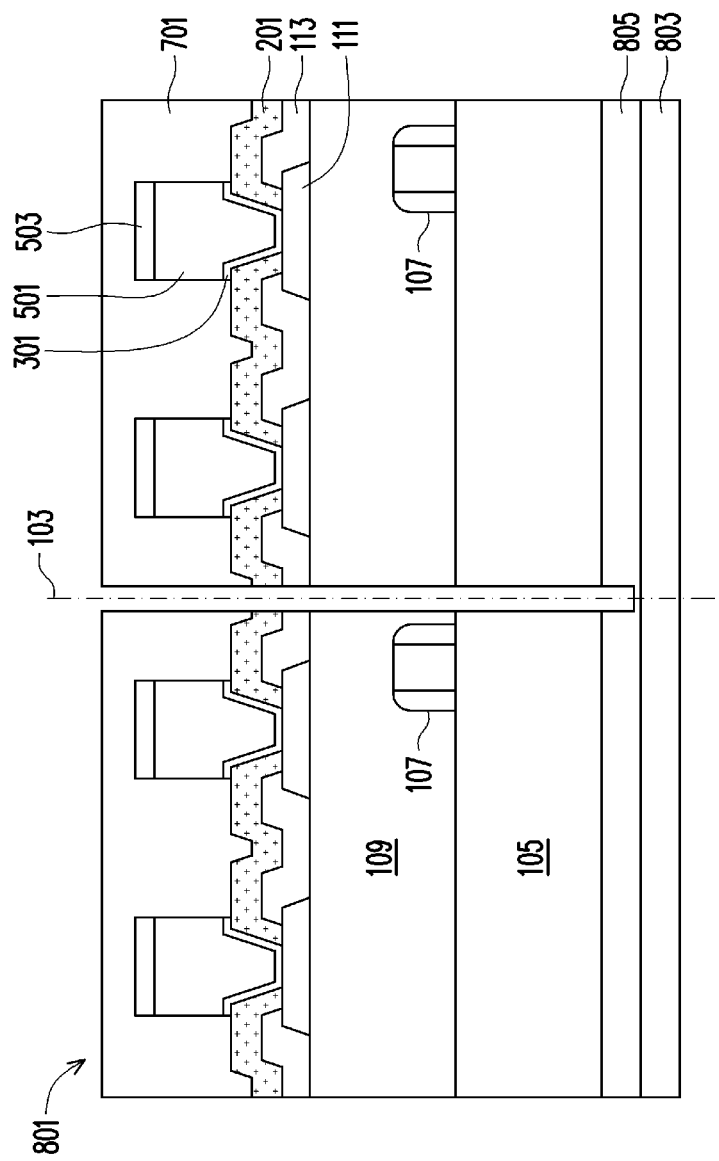

Referring to FIG. 8, after the thinning process described above is completed, the tape 703 is removed and the workpiece 100 is singulated to form individual integrated circuit dies 801. In some embodiments, the workpiece 100 may be attached to a frame 803 using an adhesive 805 to prepare the workpiece 100 for a subsequent dicing process. In some embodiments, the frame 803 may be a film frame or any suitable carrier to provide mechanical support for subsequent operations, such as dicing. The adhesive 805 may be a die attach film, a dicing film, or any suitable adhesive, epoxy, ultraviolet (UV) glue (which loses its adhesive property when exposed to UV radiation), or the like, and may be formed using a deposition process, a spin coating, a printing process, a lamination process, or the like. In some embodiments, the adhesive 805 may have a multilayer structure and may comprise a release layer (not show). The release layer may help to safely remove individual integrated circuit dies 801 from the frame 803 after the dicing process is completed. In some embodiments, the release layer may be a UV type, wherein adhesive strength of the release layer is substantially reduced after exposing the release layer to UV radiation. In other embodiments, the release layer may be a thermal type, wherein adhesive strength of the release layer is substantially reduced after exposing the release layer to a suitable heat source. In some embodiments, the workpiece 100 may be singulated into individual dies, for example, by sawing, laser ablation, a combination thereof, or the like.

As shown in FIG. 8, each integrated circuit die 801 comprises a single passivation layer (such as the passivation layer 113), a single buffer layer (such as the buffer layer 201), two contact pads (such as the contact pads 111), two conductive pillars (such as the conductive pillars 501), and a single protective layer (such as the protective layer 701). One skilled in the art will recognize that numbers of passivation layers, buffer layers, contact pads, conductive pillars, and the protective layers are provided for illustrative purpose only and are not limiting the scope of the present disclosure. In other embodiments, each integrated circuit die 801 may comprise appropriate numbers of passivation layers, buffer layers, contact pads, conductive pillars, and protective layers depending on design requirements for the integrated circuit dies 801.

Figure 9:
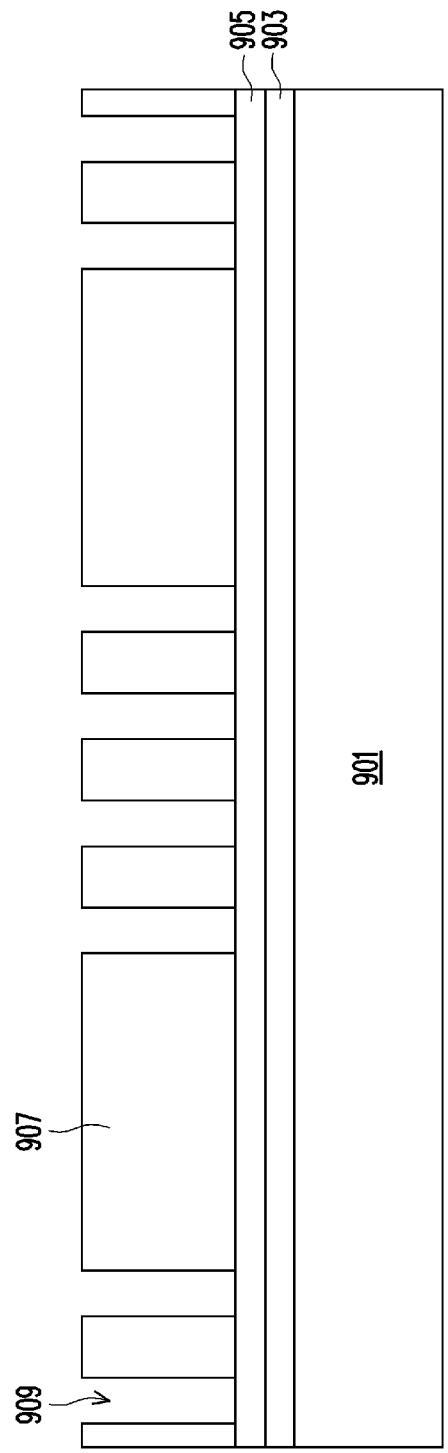
FIGS. 9-15, 16A, 16B, 17, 18A, 18B, 19A, 19B, 20A and 20B are cross-sectional views of various processing steps during fabrication of integrated circuit packages in accordance with some embodiments.

FIGS. 9-15, 16A, 16B, 17, 18A, 18B, 19A, 19B, 20A and 20B are cross-sectional views of various processing steps during fabrication of integrated circuit packages using the integrated circuit dies fabricated in FIGS. 1-8 in accordance with some embodiments. Referring first to FIG. 9, in some embodiments, a release layer 903 is formed over a carrier 901, and a seed layer 905 is formed over the release layer 903 to start forming integrated circuit packages. In some embodiments, the carrier 901 may be formed of quartz, glass, or the like, and provides mechanical support for subsequent operations. In some embodiments, the release layer 903 may comprise a light to heat conversion (LTHC) material, a UV adhesive, a polymer layer, or the like, and may be formed using a spin-on coating process, a printing process, a lamination process, or the like. In some embodiments where the release layer 903 is formed of a LTHC material, the release layer 903 when exposed to light partially or fully loses its adhesive strength and the carrier 901 can be easily removed from a backside of a subsequently formed structure. In some embodiments, the seed layer 905 may be formed using similar materials and methods as the seed layer 301 described above with reference to FIG. 3, and the description is not repeated herein for the sake of brevity. In some embodiments, the seed layer 905 may have a thickness between about 0.005 µm and about 1 µm.

Referring further to FIG. 9, a patterned mask 907 having openings 909 therein is formed over the seed layer 905. In some embodiments, the patterned mask 907 may be formed using similar materials and methods as the patterned mask 401 described above with reference to FIG. 4, and the description is not repeated herein for the sake of brevity.

Figure 10:
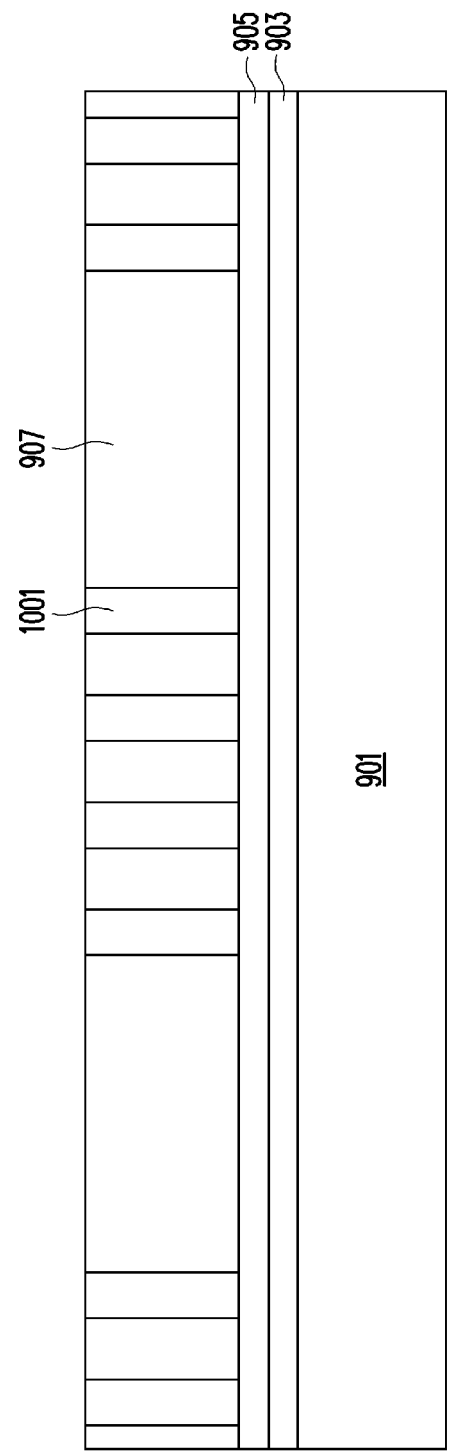
Figure 11:
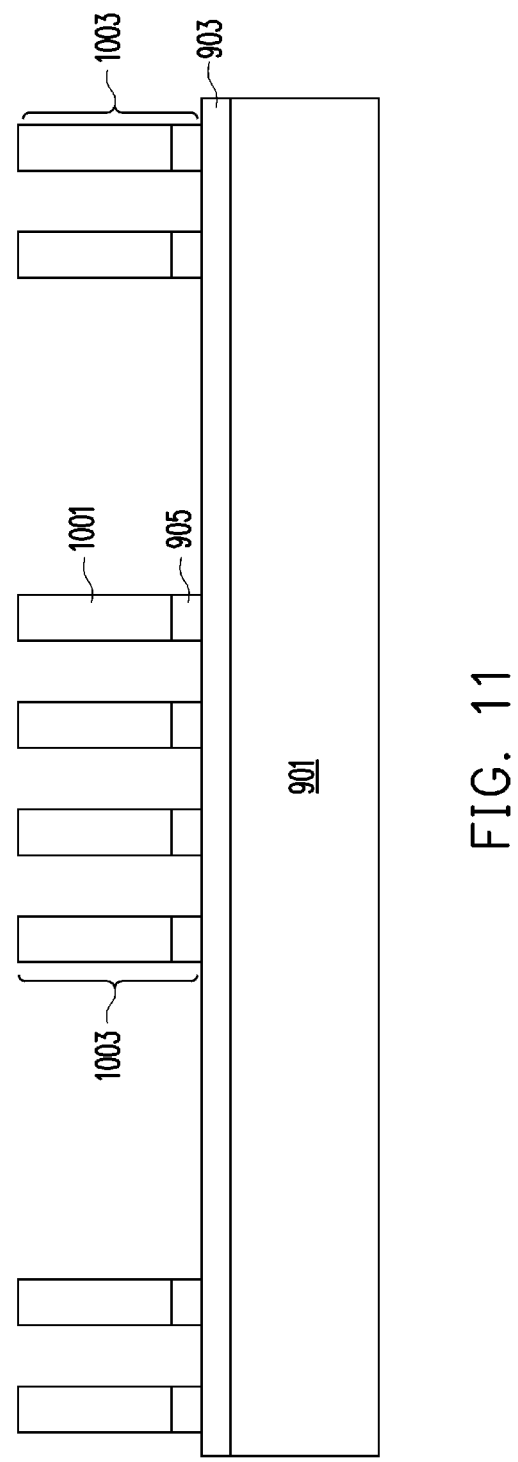

Referring to FIG. 10, conductive pillars 1001 are formed in the openings 909 (see FIG. 9). In some embodiments, the conductive pillars 1001 may be formed using similar materials and methods as the conductive pillars 501 described above with reference to FIG. 5, and the description is not repeated herein for the sake of brevity. In some embodiments, after forming the conductive pillars 1001, the patterned mask 907 is removed. In some embodiments, the patterned mask 907 may be removed using similar methods as the patterned mask 401 described above with reference to FIG. 6, and the description is not repeated herein for the sake of brevity. Subsequently, exposed portions of the seed layer 905 are removed. In some embodiments, the exposed portions of the seed layer 905 may be removed using similar methods as the exposed portions of the seed layer 301 described above with reference to FIG. 6, and the description is not repeated herein for the sake of brevity. In some embodiments, the conductive pillars 1001 with the corresponding seed layers 905 may be referred to as conductive vias 1003.

Figure 12:
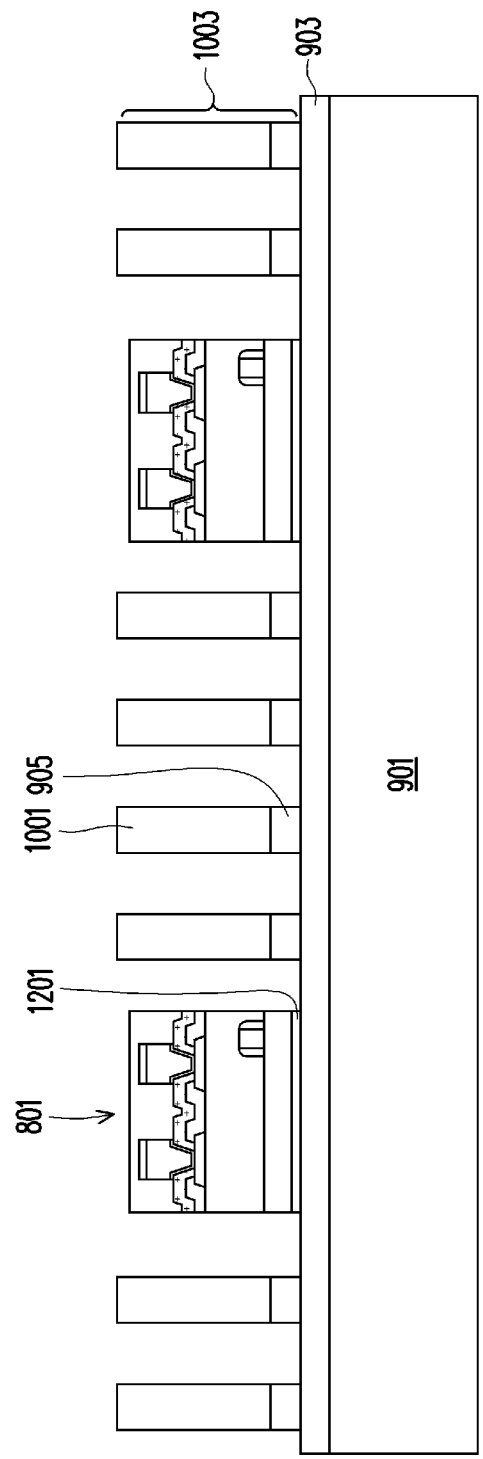

Referring to FIG. 12, integrated circuit dies 801 are attached to the release layer 903 using adhesive layers 1201. In some embodiments, the integrated circuit dies 801 are placed on the release layer 903 using, for example, a pick-and-place apparatus. In other embodiments, the integrated circuit dies 801 may be placed on the release layer 903 manually, or using any other suitable method. In some embodiments, the adhesive layer 1201 may comprise an LTHC material, a UV adhesive, a die attach film, or the like, and may be formed using a spin-on coating process, a printing process, a lamination process, or the like.

Figure 13:
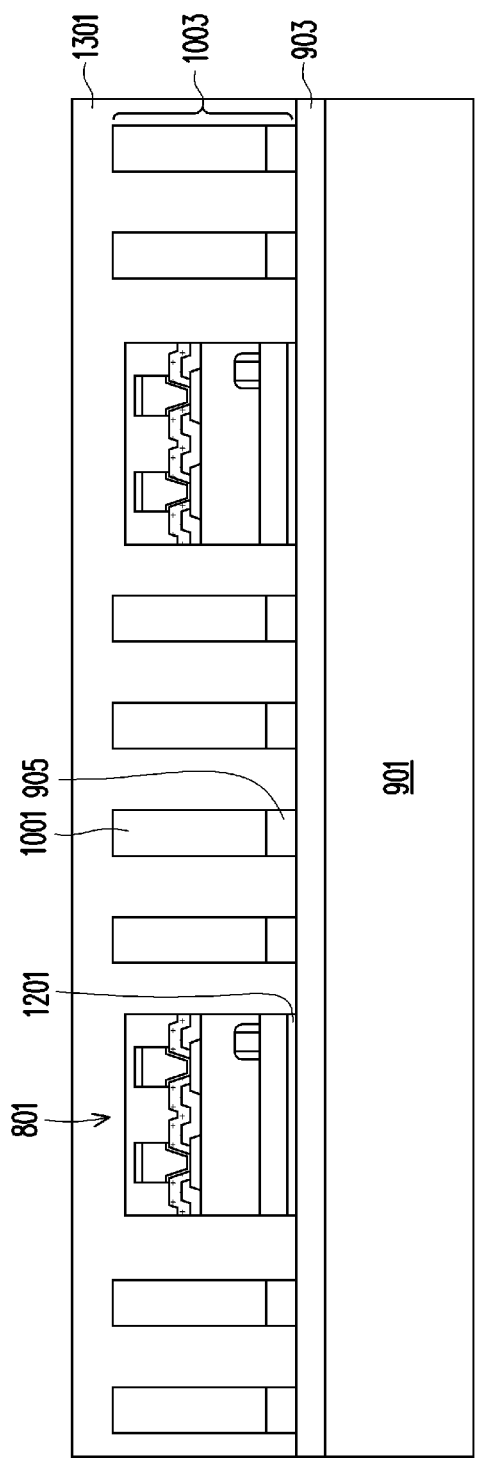

Referring to FIG. 13, an encapsulant 1301 is formed over the carrier 901, and over and surrounding the integrated circuit dies 801 and the conductive vias 1003. In some embodiments, the encapsulant 1301 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the integrated circuit dies 801 and the conductive vias 1003.

Figure 14:
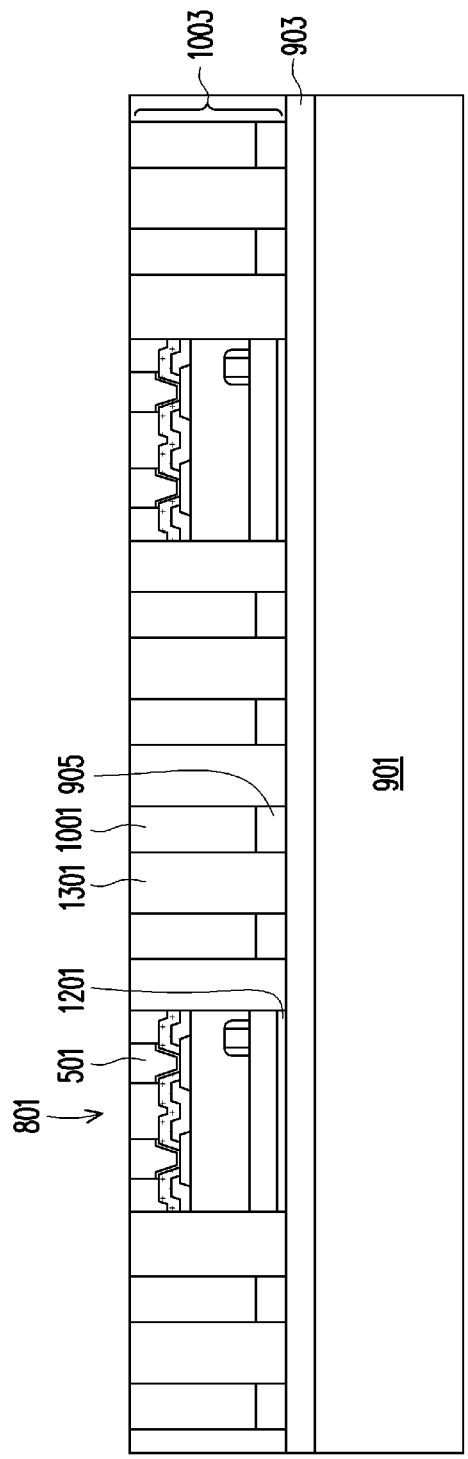

Referring further to FIG. 14, in some embodiments, the encapsulant 1301 is planarized using a CMP process, a grinding process, a combination thereof, or the like. In some embodiments, the planarization process is performed until the conductive pillars 501 of the integrated circuit dies 801 are exposed. In some embodiment, the planarization process may also remove the solder layers 503 (see FIG. 8) over the conductive pillars 501. In some embodiments, top surfaces the conductive pillars 501 are substantially coplanar with top surfaces of the conductive vias 1003 and a top surface of the encapsulant 1301.

Figure 15:
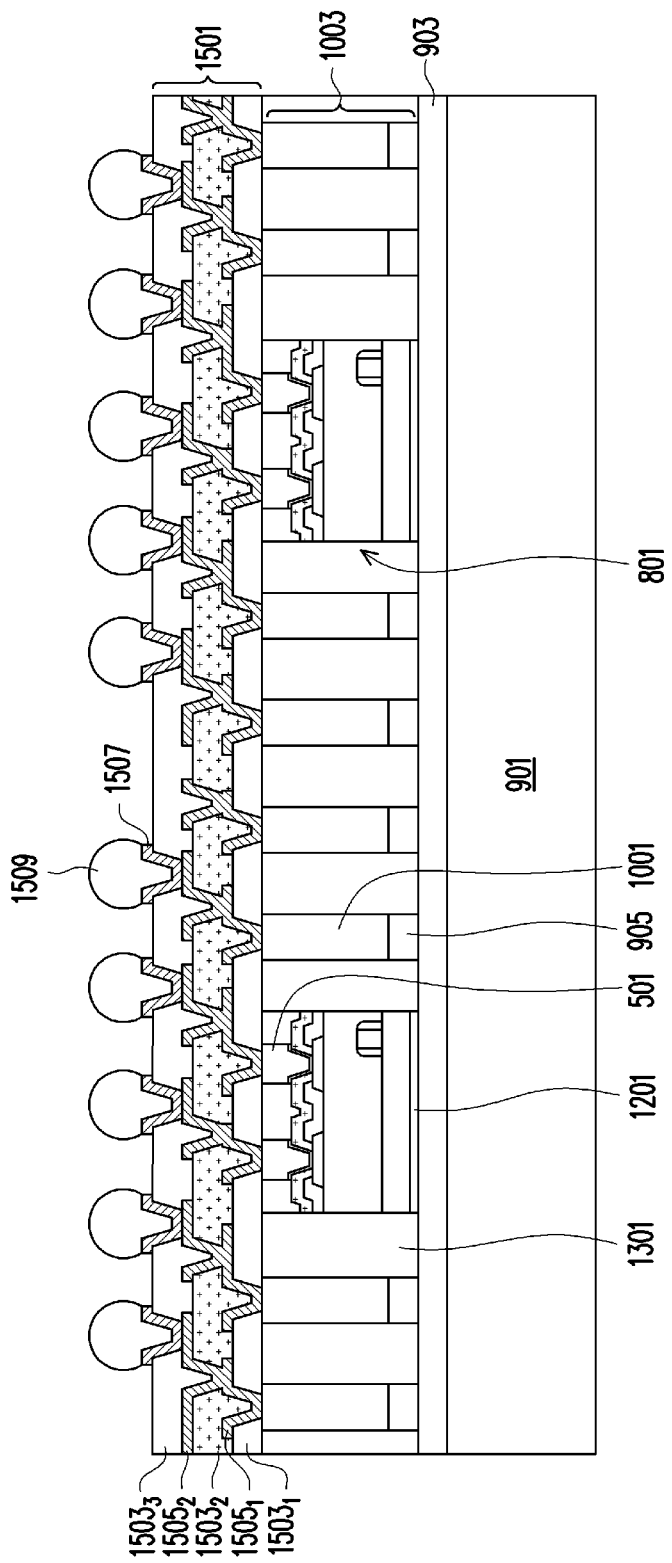

Referring to FIG. 15, a redistribution structure 1501 is formed over the integrated circuit dies 801, the conductive vias 1003 and the encapsulant 1301. In some embodiments, the redistribution structure 1501 may comprise insulating layers $1503_1$-$1503_3$, and redistribution layers (RDLs) $1505_1$ and $1505_2$ (comprising conductive lines and vias) disposed within the insulating layers $1503_1$-$1503_3$. In some embodiments, the insulating layers $1503_1$-$1503_3$ may be formed using similar materials and methods as the buffer layer 201 described above with reference to FIG. 2, and the description is not repeated herein for the sake of brevity. In some embodiments, the RDLs $1505_1$ and $1505_2$ may be formed using similar materials and methods as the conductive pillars 501 described above with reference to FIG. 5, and the description is not repeated herein for the sake of brevity.

Referring further to FIG. 15, in some embodiments, process steps for forming the redistribution structure 1501 may include patterning the insulating layer $1503_1$ to form openings therein using similar method as, for example, the buffer layer 201 described above with reference to FIG. 2, and the description is not repeated herein for the sake of brevity. The RDL $1505_1$ is formed over the insulating layer $1503_1$ and in the openings in the insulating layer $1503_1$ to contact the conductive vias 1003 and conductive pillars 501. The RDL $1505_1$ may comprise various lines/traces (running "horizontally" across a top surface of the insulating layer $1503_1$) and/or vias (extending "vertically" into the insulating layer $1503_1$). In some embodiments, a seed layer (not shown) is deposited over the insulating layer $1503_1$ and in the openings within the insulating layer $1503_1$. The seed layer may be formed using similar materials and methods as the seed layer 301 described above with reference to FIG. 3, and the description is not repeated herein for the sake of brevity. Subsequently, a patterned mask (not shown) is deposited over the seed layer to define the desired pattern for the RDL $1505_1$. In some embodiments, the patterned mask having openings therein may be formed using similar materials and methods as the patterned mask 401 described above with reference to FIG. 4, and the description is not repeated herein for the sake of brevity. In some embodiments, a conductive material is formed on the seed layer by an electro-chemical plating process, an electroless plating process, ALD, PVD, sputtering, a combination thereof, or the like. Subsequently, the patterned mask is removed and portions of the seed layer exposed after removing the patterned mask are also removed. In some embodiments, the patterned mask may be removed using similar methods as the patterned mask 401 described above with reference to FIG. 6, and the description is not repeated herein for the sake of brevity. In some embodiments, exposed portions of the seed layer may be removed using similar methods as the exposed portions of the seed layer 301 described above with reference to FIG. 6, and the description is not repeated herein for the sake of brevity.

Referring further to FIG. 15, the insulating layer $1503_2$, the RDL $1505_2$, and the insulating layer $1503_3$ are formed over the insulating layer $1503_1$ and the RDL $1505_1$, which completes the formation of the redistribution structure 1501. In some embodiments, the RDL $1505_2$ may be formed over the insulating layer $1503_2$ using similar methods as the RDL $1505_1$ and the description is not repeated herein for the sake of brevity. In some embodiments, the RDL $1505_2$ extends through the insulating layer $1503_2$ and contacts portions of the RDL $1505_1$.

As shown in FIG. 15, the redistribution structure 1501 comprises three insulating layers (such as insulating layers $1503_1$-$1503_3$) and two RDLs (such as the RDLs $1505_1$ and $1505_2$) interposed between respective insulating layers. One skilled in the art will recognize that the number of insulating layers and the number of RDLs are provided for illustrative purpose only and are not limiting the scope of the present disclosure. In other embodiments, the redistribution structure may comprise appropriate numbers of insulating layers and RDLs depending on design requirements for the resulting packaged device.

Referring further to FIG. 15, underbump metallizations (UBMs) 1507 are formed over and electrically coupled to the redistribution structure 1501. In some embodiments, a set of openings may be formed through the insulating layer $1503_3$ to expose portions of the RDL $1505_2$. In some embodiments, the UBMs 1507 may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 1507. Any suitable materials or layers of material that may be used for the UBMs 1507 are fully intended to be included within the scope of the current application. In some embodiments, connectors 1509 are formed over and electrically coupled to the UBMs 1507. In some embodiments, the connectors 1509 may be solder balls, controlled collapse chip connection (C4) bumps, ball grid array (BGA) balls, micro bumps, electroless nickel-electroless palladium-immersion gold technique (ENEPIG) formed bumps, or the like. In some embodiments where the connectors 1509 are formed of solder materials, a reflow process may be performed in order to shape the solder material into the desired bump shapes. In other embodiments, the connectors 1509 may be conductive pillars, which may be formed using similar materials and methods as the conductive pillars 501 described above reference to FIG. 5 and the description is not repeated herein for the sake of brevity. In some embodiments where the connectors 1509 comprise conductive pillars, the connectors 1509 may further comprise cap layers that may be formed on the top of the conductive pillars. In some embodiments, the cap layers may comprise a solder, nickel, tin, tin-lead, gold, silver, palladium, indium, nickel-palladium-gold, nickel-gold, the like, a combination thereof, or the like, and may be formed using an electro-chemical plating process, an electroless plating process, a combination thereof, or the like.

Figure 16A:
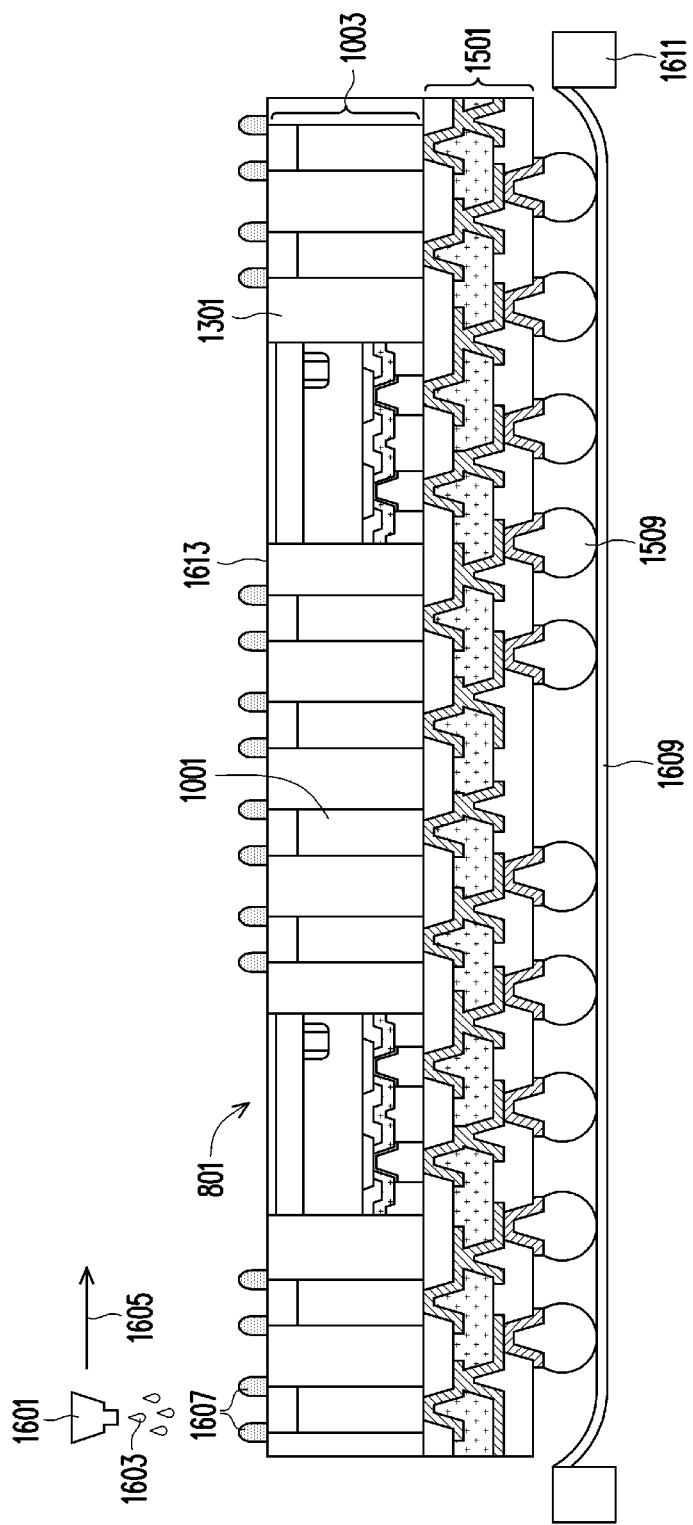

Referring to FIG. 16A, after forming the connectors 1509, the resulting structure is attached to a tape 1609 supported by a frame 1611 such that the connectors 1509 contact the tape 1609. In some embodiment, the tape 1609 may comprise a die attach film, a dicing tape, or the like. Subsequently, the carrier 901 (see FIG. 15) is detached from the resulting structure and exposes a surface 1613 of the resulting structure.

Figure 17:
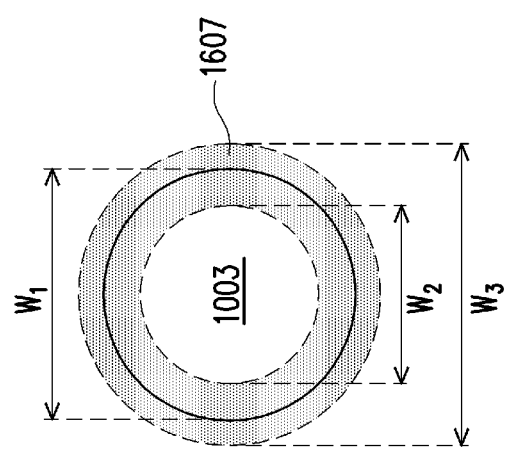

Referring further to FIG. 16A, annular-shaped structures 1607 are formed over the exposed surfaces of the conductive vias 1003 and the encapsulant 1301. In some embodiments, the annular-shaped structures 1607 surround the corresponding conductive vias 1003 in a plan view as illustrated in FIG. 17. In some embodiments, the annular-shaped structures 1607 are formed by dispensing a polymer material 1603 over desired locations on the surface 1613 using a dispensing apparatus 1601. In some embodiments, the polymer material 1603 may comprise UV curable polymer materials such as epoxies, acrylates, urethanes, thiols, combinations thereof, or the like. In some embodiments, the polymer material 1603 may be dispensed in a liquid form at or near interfaces between the conductive vias 1003 and the encapsulant 1301. In some embodiments, the dispensing apparatus 1601 may scan the surface 1613 as indicated by an arrow 1605 and dispense the polymer material 1603 over the desired locations on the surface 1613. In some embodiments, the dispensing apparatus 1601 may comprise a UV light source. In some embodiments, after dispensing the polymer material 1603 over the desired location on the surface 1613, the UV light source may expose the dispensed polymer material 1603 to the UV light. In some embodiments, the wavelength of the UV light may be between about 250 nm and about 600 nm. In some embodiments, the UV light source may expose the dispensed polymer material 1603 to the UV light for a time between about 0.1 ms and about 1 ms. Under the influence of the UV light the dispensed polymer material 1603 is cured and undergoes polymerization (cross-linking) to harden the dispensed polymer material 1603. After the curing, the dispensed polymer material 1603 forms the annular-shaped structures 1607, such that the annular-shaped structure 1607 extends across interfaces between the encapsulant 1301 and the conductive vias 1003.

In other embodiments, the polymer material 1603 may comprise thermosetting polymer materials, such as epoxies, polyimides, combinations thereof, or the like. In such embodiments, the polymer material 1603 may be cured by subjecting the polymer material 1603 to a suitable thermal treatment. In some embodiments, the thermal treatment may be performed at a temperature between about 100° C. and about 400° C. In some embodiments, the thermal treatment may be performed for a time between about 5 min and about 4 hr.

Figure 16B:
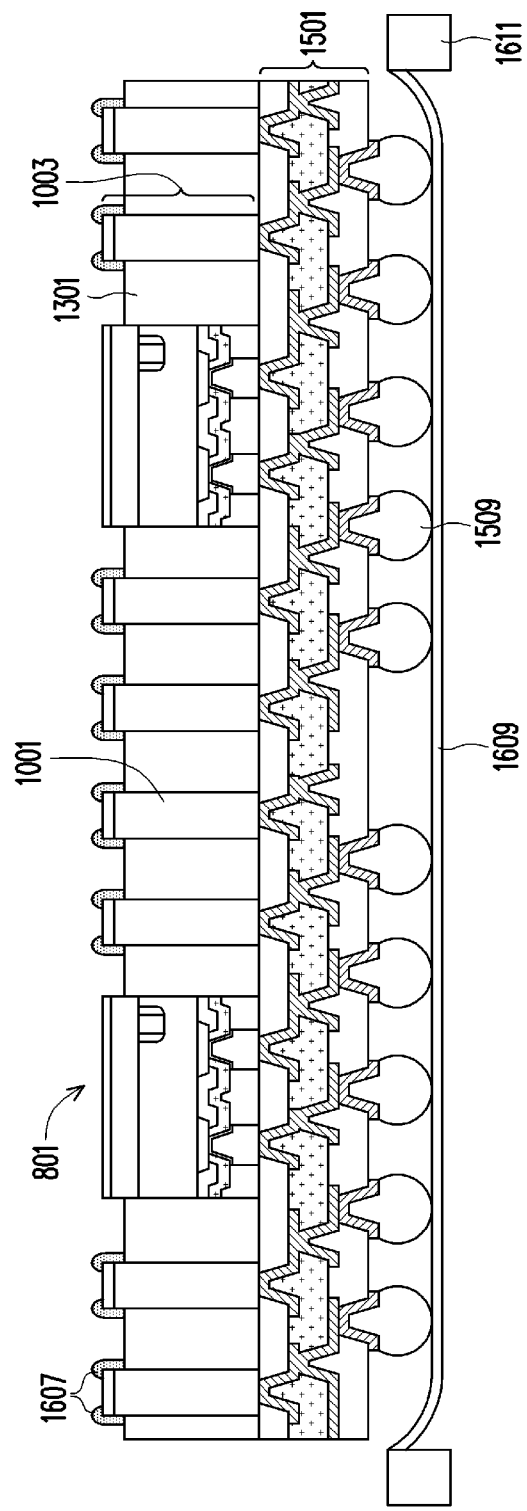

In some embodiments, before forming the annular-shaped structures 1607, an exposed surface of the encapsulant 1301 may be recessed to expose sidewalls of the conductive vias 1003 as illustrated in FIG. 16B. In such embodiments, the annular-shaped structures 1607 contact the exposed sidewalls of the conductive vias 1003. In some embodiments, the exposed surface of the encapsulant 1301 may be recessed using a suitable etching process such as, for example, an anisotropic dry etching process. In some embodiments, the suitable etching process may be performed using a mixture of gasses comprising $CF_4$, $O_2$, $N_2$, combinations thereof, or the like. As described above in greater detail, no separate patterning process is performed on the dispensed polymer material 1603 to form the annular-shaped structures 1607. Accordingly, various embodiments described herein allow for reducing the number of manufacturing steps and the manufacturing cost for forming integrated circuit packages.

Referring to FIG. 17, a plan view of the conductive via 1003 and the corresponding annular-shaped structure 1607 is illustrated. In some embodiments, the conductive via 1003 has a width $W_1$. In some embodiment, the annular-shaped structure 1607 has an inner diameter $W_2$ and an outer diameter $W_3$, such that $W_3$ is greater than $W_2$. In some embodiments, $W_2$ is less than $W_1$, and $W_1$ is less than $W_3$, such that the annular-shaped structure 1607 overlaps with an interface between the conductive via 1003 and the encapsulant 1301. In some embodiments, the width $W_1$ is between about 20 μm and about 500 μm. In some embodiments, the inner diameter $W_2$ is between about 10 μm and about 450 μm. In some embodiments, the outer diameter $W_3$ is between about 30 μm and about 600 μm. In some embodiments, a ratio $W_1/W_2$ is between about 1.1 and about 2.0. In some embodiments, a ratio $W_3/W_2$ is between about 1.2 and about 2.5. In the illustrated embodiment, the conductive via 1003 has a circular shape in a plan view and the annular-shaped structure 1607 has a ring shape in a plan view. In other embodiments, the conductive via 1003 may have an oval shape, a square shape, a rectangular shape, a polygonal shape, or the like in a plan view, and inner and outer edges of the annular-shaped structure 1607 may have an oval shape, a square shape, a rectangular shape, a polygonal shape, or the like in a plan view. In some embodiments, the conductive via 1003 and the annular-shaped structure 1607 may have similar shapes in a plan view. For example, in some embodiments where the conductive via 1003 has an oval shape in a plan view, inner and outer edges of the corresponding annular-shaped structure 1607 may also have an oval shape.

Figure 18A:
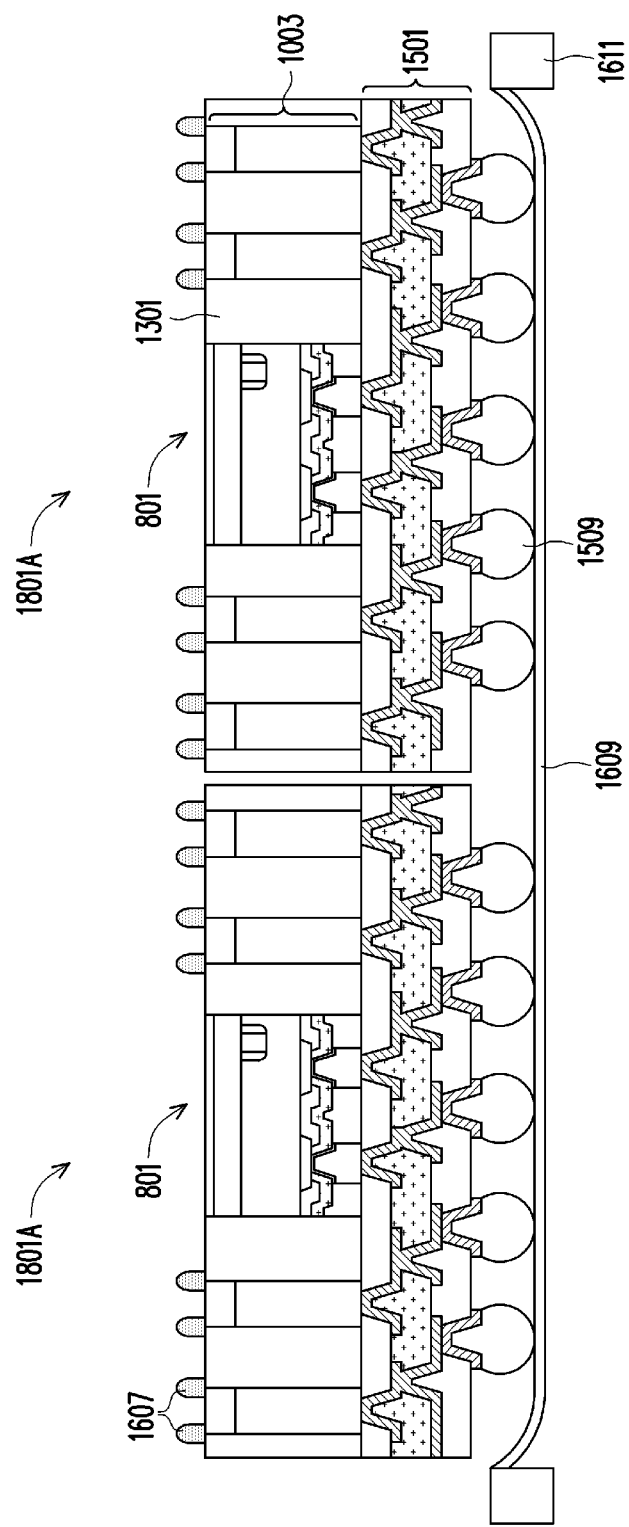
Figure 18B:
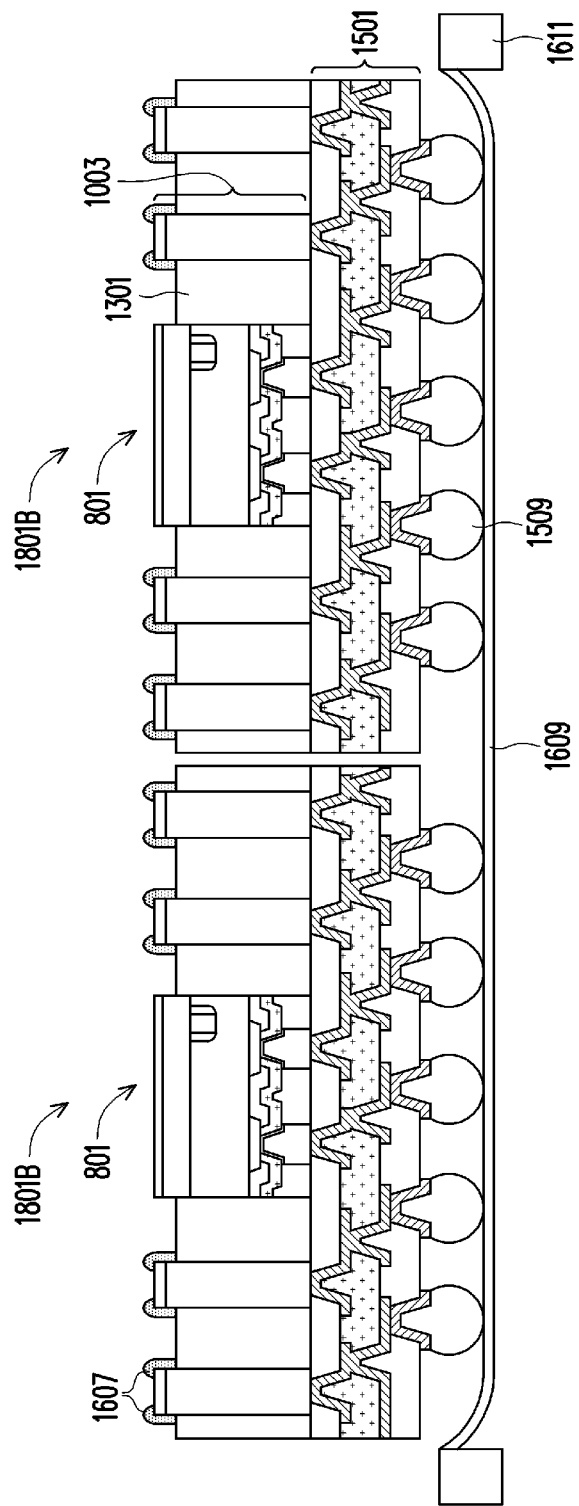

Referring to FIGS. 18A and 18B, after forming the annular-shaped structures 1607, the resulting structure may be diced to form individual integrated circuit packages 1801A and 1801B, respectively. The integrated circuit package 1801A corresponds to embodiments where the encapsulant 1301 is not recessed before forming the annular-shaped structures 1607. The integrated circuit package 1801B corresponds to embodiments where the encapsulant 1301 is recessed before forming the annular-shaped structures 1607. In some embodiments, the resulting structure may be diced by sawing, a laser ablation method, a combination thereof, or the like. Subsequently, each of the integrated circuit packages 1801A and each of the integrated circuit packages 1801B may be tested to identify known good packages (KGPs) for further processing.

Figure 19A:
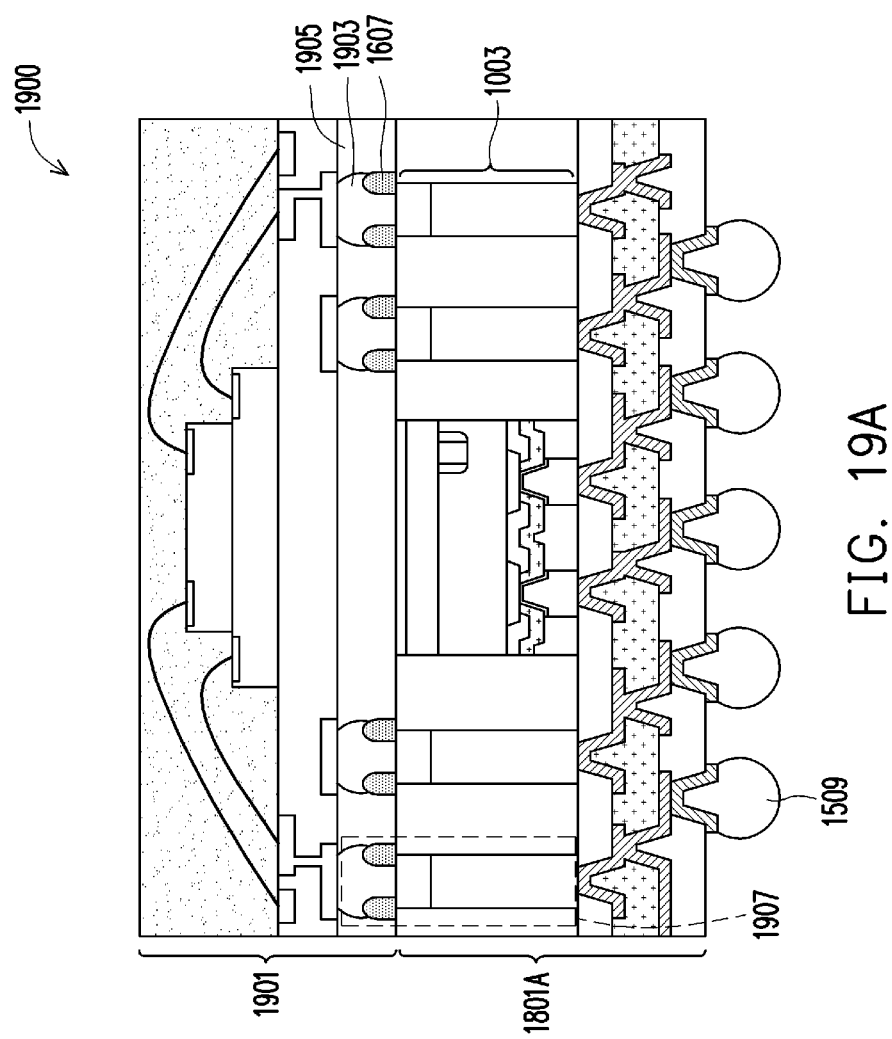

Referring to FIG. 19A, in some embodiments, a workpiece 1901 is bonded to the integrated circuit package 1801A with a set of connectors 1903 extending through openings in the annular-shaped structures 1607 to form a stacked semiconductor device 1900. In the illustrated embodiment, the workpiece 1901 is a package. In other embodiments, the workpiece 1901 may be one or more dies, a printed circuit board (PCB), a package substrate, an interposer, or the like. In some embodiments wherein the workpiece 1901 is a package, the stacked semiconductor device 1900 is a package-on package (PoP) device. In other embodiments wherein the workpiece 1901 is a die, the stacked semiconductor device 1900 is a chip-on-package (CoP) device. In some embodiments, the connectors 1903 may be formed using similar material and methods as the connectors 1509 described above with reference to FIG. 15, and the description is not repeated herein for the sake of brevity. In other embodiments, the workpiece 1901 may be bonded to the integrated circuit package 1801A before the dicing process described above with reference to FIG. 18A.

Referring further to FIG. 19A, an underfill material 1905 may be injected or otherwise formed in the space between the workpiece 1901 and the integrated circuit package 1801A and surrounding the connectors 1903. The underfill material 1905 may, for example, be a liquid epoxy, deformable gel, silicon rubber, or the like, that is dispensed between the structures, and then cured to harden. This underfill material 1905 may be used, among other things, to reduce damage to and to protect the connectors 1903.

Figure 19B:
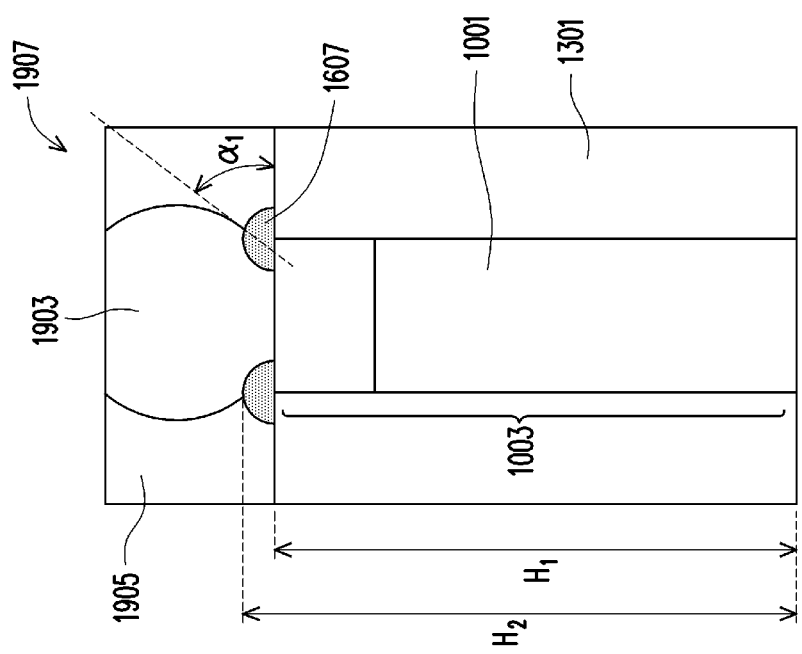

FIG. 19B illustrates a magnified cross-sectional view of a region 1907 of FIG. 19A. In some embodiments, the encapsulant 1301 and conductive vias 1003 have a height $H_1$, and a topmost surface of the annular-shaped structure 1607 has a height $H_2$ with respect to a bottom surface of the encapsulant 1301. In some embodiments, the height $H_2$ is greater than height $H_1$. In some embodiments, the height $H_1$ is between about 30 µm and about 300 µm. In some embodiments, the height $H_2$ is between about 35 µm and about 350 µm. In some embodiments, a ratio $H_1/H_2$ is between about 0.8 and about 0.99. In some embodiment, a sidewall of the connector 1903 forms an angle $\alpha_1$ with a top surface of the corresponding via 1003. In some embodiments, the angle $\alpha_1$ is less than about 70 degrees, such as between about 20 degrees and about 50 degrees. In some embodiments, the annular-shaped structure 1607 separates the encapsulant 1301 from underfill material 1905 at the interface between the conductive via 1003 and the corresponding connector 1903. In some embodiments, by forming the annular-shaped structure 1607 at the interface between the conductive via 1003 and the corresponding connector 1903, delamination of the encapsulant 1301 from the conductive via 1003 and delamination of the underfill material 1905 from the connector 1903 may be prevented or eliminated while performing a reliability test on the stacked semiconductor device 1900 and/or during the normal operation of the stacked semiconductor device 1900. In some embodiments, by forming the annular-shaped structure 1607 between the encapsulant 1301 and the underfill material 1905, formation of cracks in the encapsulant 1301 and/or the underfill material 1905, and propagation of the cracks between the encapsulant 1301 and the underfill material 1905 may be prevented or eliminated while performing a reliability test on the stacked semiconductor device 1900 and/or during the normal operation of the stacked semiconductor device 1900.

Figure 20A:
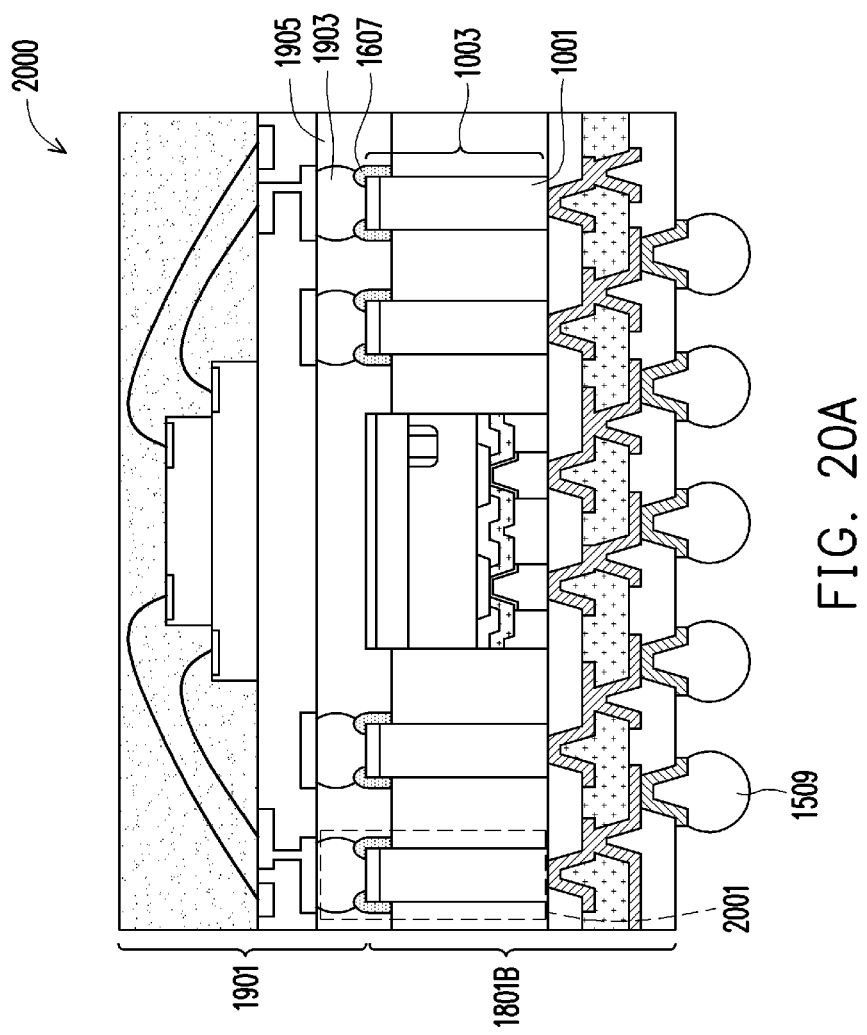

Referring to FIG. 20A, in some embodiments, a workpiece 1901 is bonded to the integrated circuit package 1801B with a set of connectors 1903 extending through openings in the annular-shaped structures 1607 to form a stacked semiconductor device 2000. In the illustrated embodiment, the workpiece 1901 is a package. In other embodiments, the workpiece 1901 may be one or more dies, a printed circuit board (PCB), a package substrate, an interposer, or the like. In some embodiments wherein the workpiece 1901 is a package, the stacked semiconductor device 2000 is a package-on package (PoP) device. In other embodiments wherein the workpiece 1901 is a die, the stacked semiconductor device 2000 is a chip-on-package (CoP) device. In other embodiments, the workpiece 1901 may be bonded to the integrated circuit package 1801B before the dicing process described above with reference to FIG. 18B. In some embodiments, the underfill material 1905 may be injected or otherwise formed in the space between the workpiece 1901 and the integrated circuit package 1801B and surrounding the connectors 1903.

Figure 20B:
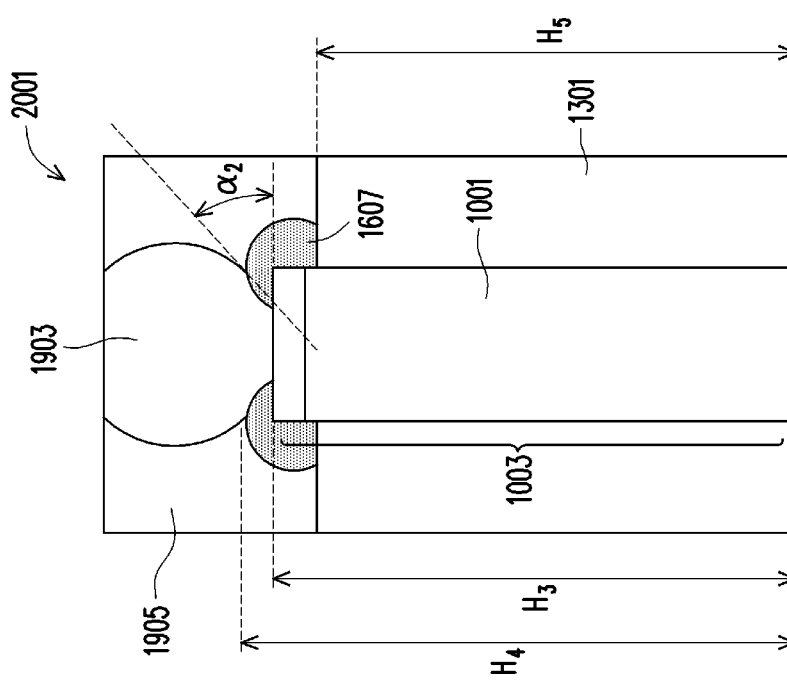

FIG. 20B illustrates a magnified cross-sectional view of a region 2001 of FIG. 20A. In some embodiments, the encapsulant 1301 has a height $H_5$, the conductive via 1003 has a height $H_3$, and a topmost surface of the annular-shaped structure 1607 has a height $H_4$ with respect to a bottom surface of the encapsulant 1301. In some embodiments, the height $H_4$ is greater than height $H_3$, and height $H_3$ is greater than height $H_5$. In some embodiments, the height $H_3$ is between about 30 µm and about 300 µm. In some embodiments, the height $H_4$ is between about 35 µm and about 350 µm. In some embodiments, the height $H_5$ is between about 20 µm and about 290 µm. In some embodiments, a ratio $H_3/H_4$ is between about 0.8 and about 0.99. In some embodiments, a ratio $H_4/H_5$ is between about 1.1 and about 1.5. In some embodiment, a sidewall of the connector 1903 forms an angle $\alpha_2$ with a top surface of the corresponding conductive via 1003. In some embodiments, the angle $\alpha_2$ is less than about 70 degrees, such as between about 30 degrees and about 50 degrees. In some embodiments, the annular-shaped structure 1607 separates the encapsulant 1301 from underfill material 1905 at the interface between the conductive via 1003 and the corresponding connector 1903. In some embodiments, by forming the annular-shaped structure 1607 at the interface between the conductive via 1003 and the corresponding connector 1903, delamination of the encapsulant 1301 from the conductive via 1003 and delamination of the underfill material 1905 from the connector 1903 may be prevented or eliminated while performing a reliability test on the stacked semiconductor device 2000 and/or during the normal operation of the stacked semiconductor device 2000. In some embodiments, by forming the annular-shaped structure 1607 between the encapsulant 1301 and the underfill material 1905, formation of cracks in the encapsulant 1301 and/or the underfill material 1905 and propagation of the cracks between the encapsulant 1301 and the underfill material 1905 may be prevented or eliminated while performing a reliability test on the stacked semiconductor device 2000 and/or during the normal operation of the stacked semiconductor device 2000.

FIGS. 21-24, 25A, 25B and 26 are cross-sectional views of various processing steps during fabrication of integrated circuit packages using the integrated circuit dies fabricated in FIGS. 1-8 in accordance with some embodiments. Embodiments described below with reference to FIGS. 21-24, 25A, 25B and 26 are similar to embodiments described above with reference to FIGS. 9-15, 16A, 16B, 17, 18A, 18B, 19A, 19B, 20A and 20B, with like elements labeled using like numerical references.

Figure 21:
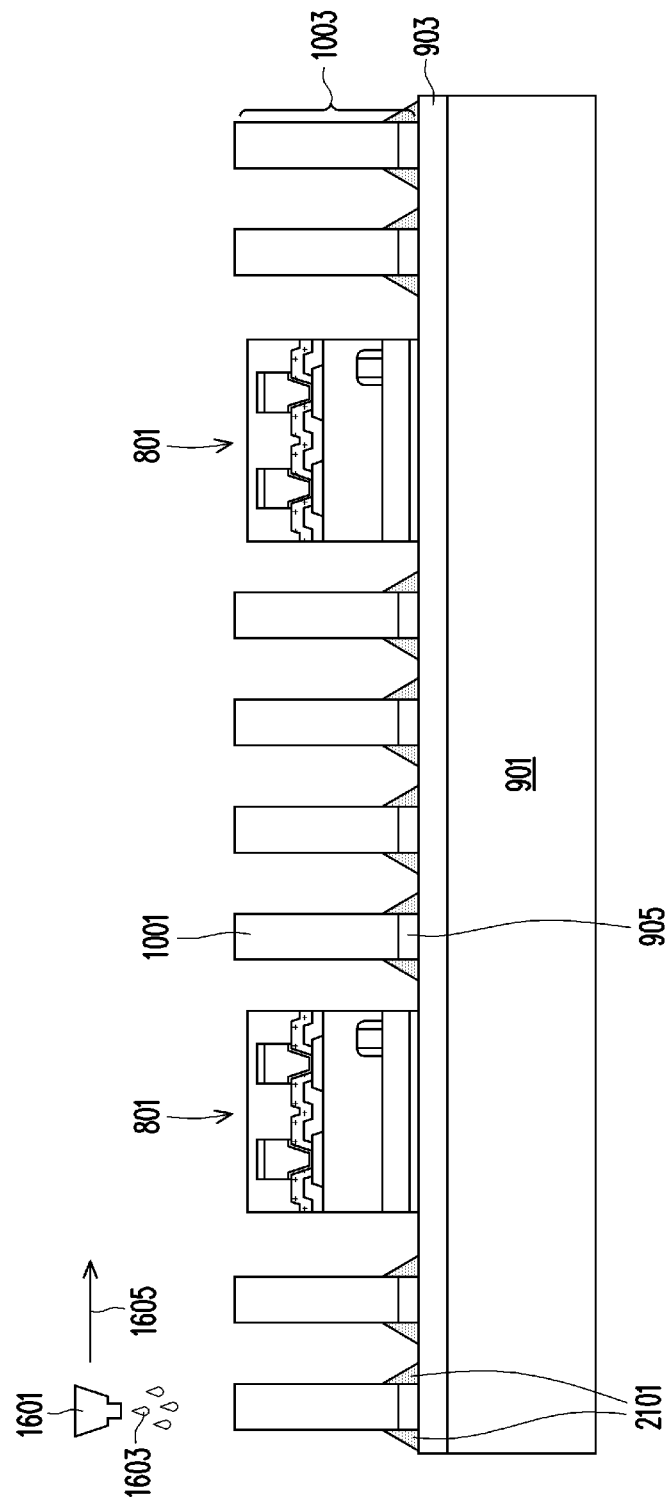

Referring to FIG. 21, in some embodiments, a release layer 903 is formed over a carrier 901, conductive vias 1003 are formed over the release layer 903, and integrated circuit dies 801 are attached to the release layer 903. In some embodiments, the conductive vias 1003 comprise seed layers 905 and conductive pillars 1001 over the seed layers 905. In some embodiment, the structure illustrated in FIG. 21 may be formed using methods as described above with reference to FIGS. 9-12, and the description in not repeated herein for the sake of brevity.

Referring further to FIG. 21, after forming the conductive vias 1003 and attaching the integrated circuit dies 801 to the release layer 903, annular-shaped structures 2101 are formed over the release layer 903 and surrounding the conductive vias 1003. In some embodiments, the annular-shaped structures 2101 are formed by dispensing a polymer material 1603 over desired locations on the release layer 903 using a dispensing apparatus 1601. In some embodiments, the dispensing apparatus 1601 may scan the release layer 903 as indicated by an arrow 1605 and dispense the polymer material 1603 in a liquid form over the desired locations on the release layer 903. In some embodiments, the polymer material 1603 may comprise UV curable polymer materials such as epoxies, acrylates, urethanes, thiols, combinations thereof, or the like. In some embodiments, the dispensing apparatus 1601 may comprise a UV light source. In some embodiments, after dispensing the polymer material 1603 over the desired locations on the release layer 903, the UV light source may expose the dispensed polymer material 1603 to the UV light. In some embodiments, the wavelength of the UV light may be between about 250 nm and about 600 nm. In some embodiments, the UV light source may expose the dispensed polymer material 1603 to the UV light for a time between 0.1 ms and about 1 ms. Under the influence of the UV light, the dispensed polymer material 1603 is cured and undergoes polymerization (cross-linking) to harden the dispensed polymer material 1603. After the curing, the dispensed polymer material 1603 forms the annular-shaped structures 2101. In some embodiments, exposed surfaces of the annular-shaped structures 2101 may be non-planar surfaces, such as concave surfaces (see FIG. 25B).

In other embodiments, the polymer material 1603 may comprise thermosetting polymer materials, such as epoxies, polyimides, combinations thereof, or the like. In such embodiments, the polymer material 1603 may be cured by subjecting the polymer material 1603 to a suitable thermal treatment. In some embodiments, the thermal treatment may be performed at a temperature between about 100° C. and about 400° C. In some embodiments, the thermal treatment may be performed for a time between about 5 min and about 4 hr. As described above in greater detail, no separate patterning process is performed on the dispensed polymer material 1603 to form the annular-shaped structures 2101. Accordingly, various embodiments described herein allow for reducing the number of manufacturing steps and the manufacturing cost for forming integrated circuit packages.

Figure 22:
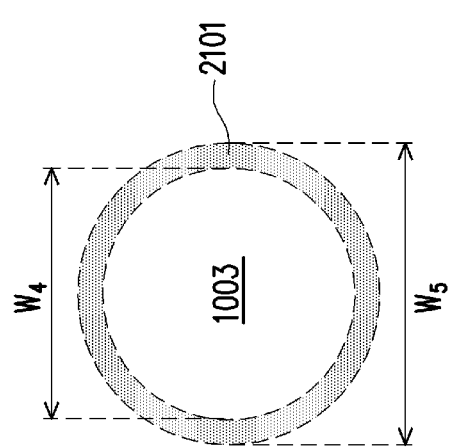

Referring to FIG. 22, a plan view of the conductive via 1003 and the corresponding annular-shaped structure 2101 is illustrated. In some embodiments, the conductive via 1003 has a width $W_4$. In some embodiment, the annular-shaped structure 2101 has an inner diameter $W_4$ and an outer diameter $W_5$, such that $W_5$ is greater than $W_4$. In some embodiments, the inner diameter $W_4$ is between about 10 μm and about 450 μm. In some embodiments, the outer diameter $W_5$ is between about 30 μm and about 600 μm. In some embodiments, a ratio $W_4/W_5$ is between about 0.2 and about 0.99. In some embodiments, the conductive via 1003 may be completely disposed within an opening in the annular-shaped structure 2101. In the illustrated embodiment, the conductive via 1003 has a circular shape in a plan view and the annular-shaped structure 2101 has a ring shape in a plan view. In other embodiments, the conductive via 1003 may have an oval shape, a square shape, a rectangular shape, a polygonal shape, or the like in a plan view, and inner and outer edges of the annular-shaped structure 2101 may have an oval shape, a square shape, a rectangular shape, a polygonal shape, or the like in a plan view. In some embodiments, the conductive via 1003 and the annular-shaped structure 2101 may have similar shapes in a plan view. For example, in some embodiments where the conductive via 1003 has an oval shape in a plan view, inner and outer edges of the corresponding annular-shaped structure 2101 may also have an oval shape.

Figure 23:
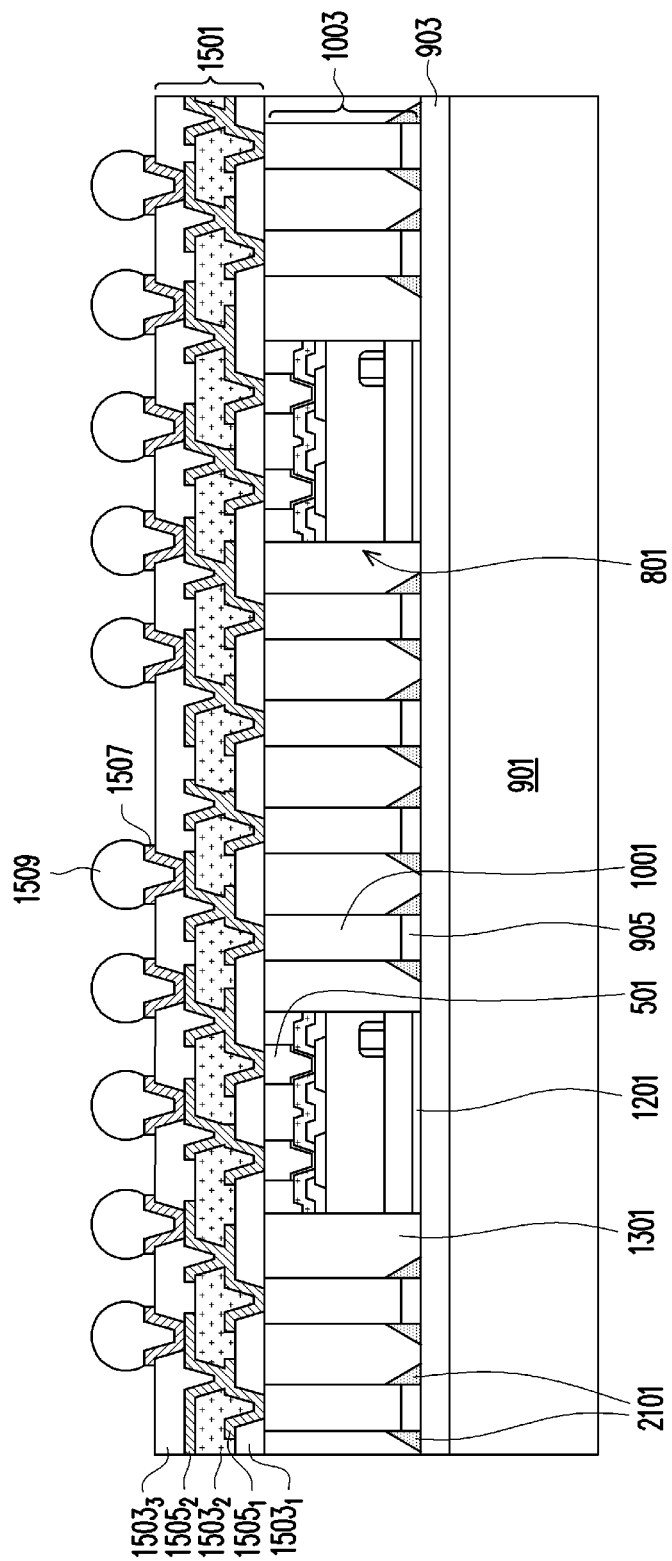

Referring to FIG. 23, an encapsulant 1301 is formed over the carrier 901, and over and surrounding the integrated circuit dies 801 and the conductive vias 1003. Subsequently, the encapsulant 1301 is planarized, such that top surfaces the conductive pillars 501 of the integrated circuit dies 801 are substantially coplanar with top surfaces of the conductive vias 1003 and a top surface of the encapsulant 1301. In some embodiments, the encapsulant 1301 may be formed and planarized using methods as described with reference to FIGS. 13 and 14, and description is not repeated for the sake of brevity.

Referring further to FIG. 23, after planarizing the encapsulant 1301, a redistribution structure 1501 is formed over the integrated circuit dies 801, the conductive vias 1003 and the encapsulant 1301. Subsequently, underbump metallizations (UBMs) 1507 are formed over and electrically coupled to the redistribution structure 1501, and connectors 1509 are formed over and electrically coupled to the UBMs 1507. In some embodiments, the redistribution structure 1501, the UBMs 1507 and the connectors 1509 may be formed using methods as described above with reference to FIG. 15, and the description is no repeated herein for the sake of brevity.

Figure 24:
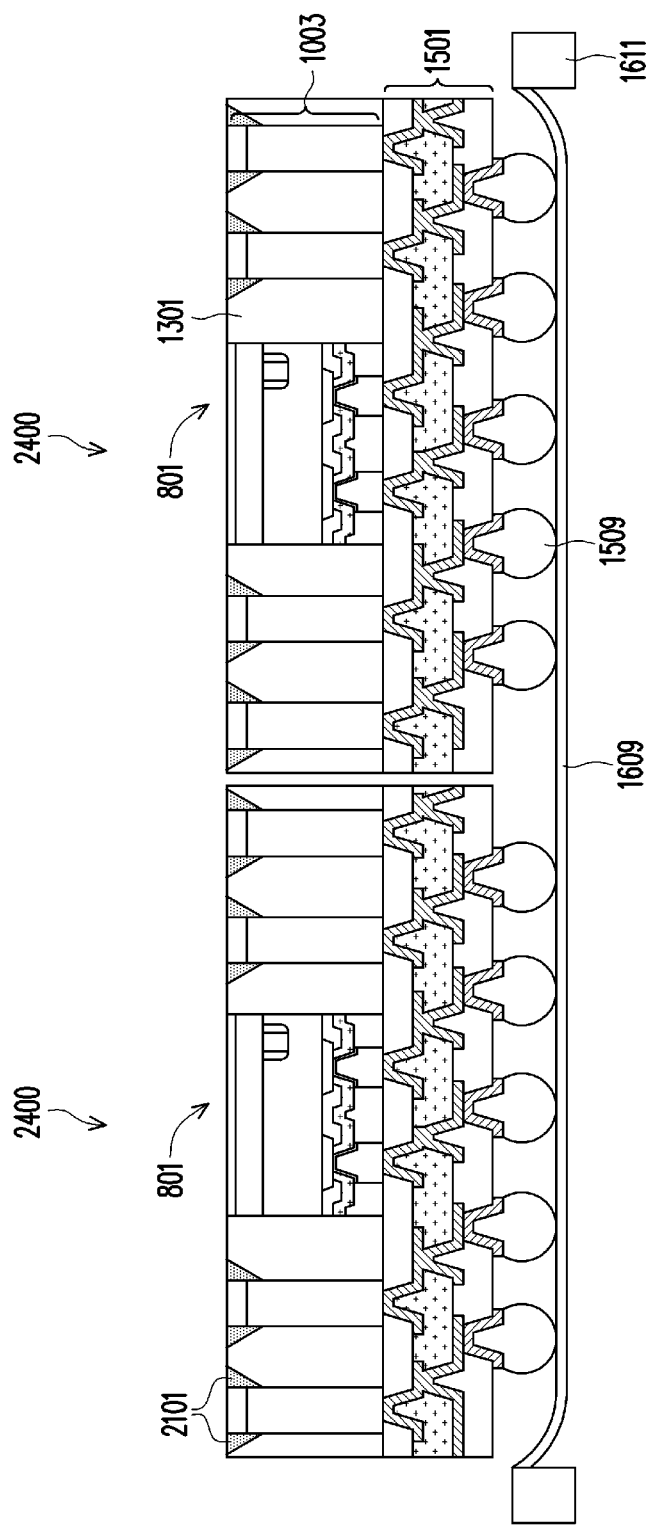

Referring to FIG. 24, in some embodiments, the resulting structure is attached to a tape 1609 supported by a frame 1611 such that the connectors 1509 contact the tape 1609. In some embodiment, the tape 1609 may comprise a die attach film, a dicing tape, or the like. Subsequently, the carrier 901 (see FIG. 23) is detached from the resulting structure is diced to form individual integrated circuit packages 2400. In some embodiments, the resulting structure may be diced by sawing, a laser ablation method, a combination thereof, or the like. Subsequently, each of the integrated circuit packages 2400 may be tested to identify known good packages (KGPs) for further processing.

Referring to FIG. 25A, in some embodiments, a workpiece 1901 is bonded to the integrated circuit package 2400 with a set of connectors 1903 coupled to corresponding conductive vias 1003 to form a stacked semiconductor device 2500. In the illustrated embodiment, the workpiece 1901 is a package. In other embodiments, the workpiece 1901 may be one or more dies, a printed circuit board (PCB), a package substrate, an interposer, or the like. In some embodiments wherein the workpiece 1901 is a package, the stacked semiconductor device 2500 is a package-on package (PoP) device. In other embodiments wherein the workpiece 1901 is a die, the stacked semiconductor device 2500 is a chip-on-package (CoP) device. In other embodiments, the workpiece 1901 may be bonded to the integrated circuit package 2400 before the dicing process described above with reference to FIG. 24.

Referring further to FIG. 25A, an underfill material 1905 may be injected or otherwise formed in the space between the workpiece 1901 and the integrated circuit package 2400 and surrounding the connectors 1903. In some embodiments, the underfill material 1905 may be formed using methods described with reference to FIG. 18A, and the description is not repeated herein for the sake of brevity.

Figure 25B:
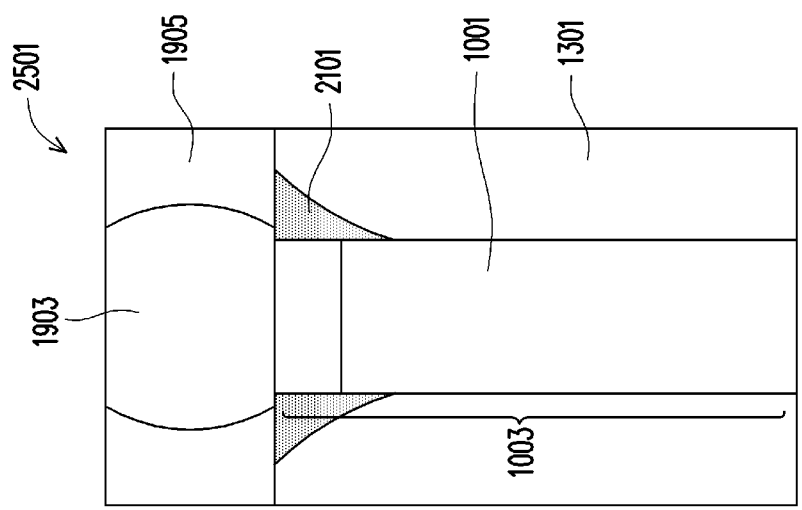

FIG. 25B illustrates a magnified cross-sectional view of a region 2501 of FIG. 25A. In some embodiment, surfaces of the annular-shaped structures 2101 in contact with the encapsulant 1301 may be non-planar surfaces, such as concave surfaces. In some embodiments, the annular-shaped structure 2101 separates the encapsulant 1301 from underfill material 1905 at the interface between the conductive via 1003 and the corresponding connector 1903. In some embodiments, by forming the annular-shaped structure 2101 at the interface between the conductive via 1003 and the corresponding connector 1903, delamination of the encapsulant 1301 from the conductive via 1003 and delamination of the underfill material 1905 from the connector 1903 may be prevented or eliminated while performing a reliability test on the stacked semiconductor device 2500 and/or during the normal operation of the stacked semiconductor device 2500. In some embodiments, by forming the annular-shaped structure 2101 between the encapsulant 1301 and the underfill material 1905, formation of cracks in the encapsulant 1301 and/or the underfill material 1905 and propagation of the cracks between the encapsulant 1301 and the underfill material 1905 may be prevented or eliminated while performing a reliability test on the stacked semiconductor device 2500 and/or during the normal operation of the stacked semiconductor device 2500.

Figure 26:
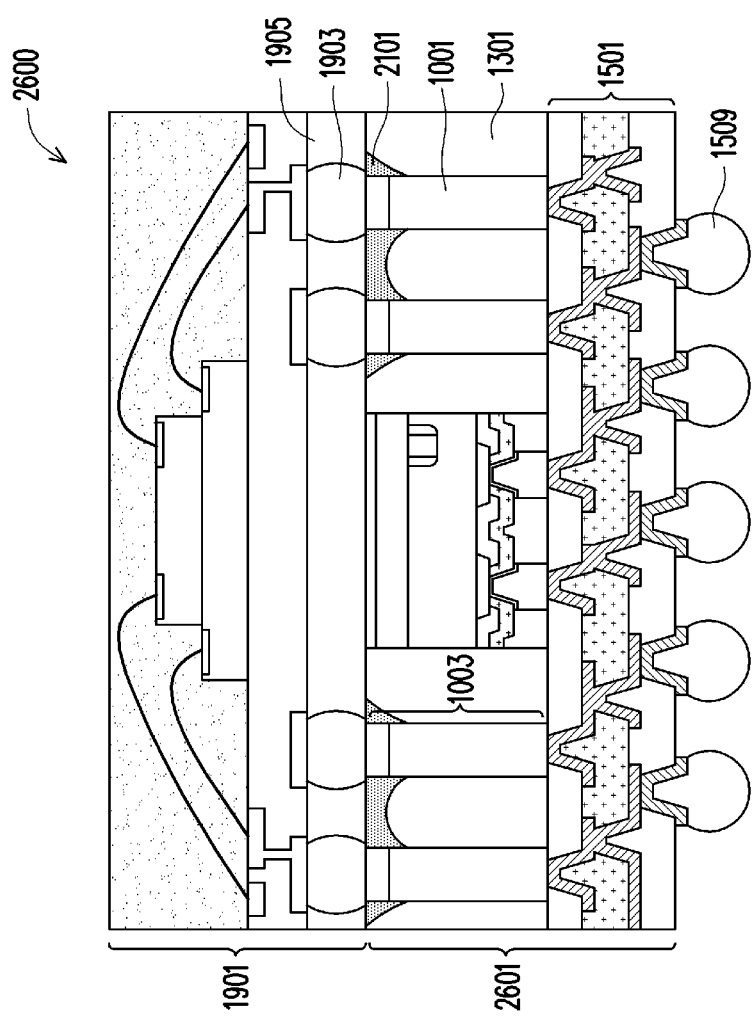

FIG. 26 illustrates a stacked semiconductor device 2600 formed by bonding a workpiece 1901 to an integrated circuit package 2601 with a set of connectors 1903 coupled to corresponding conductive vias 1003. In some embodiments, the integrated circuit package 2601 may be formed using similar methods as the integrated circuit packages 2400 described above with reference to FIGS. 21-24, with like elements being labeled by like numerical references, and the description is not repeated herein for the sake of brevity. In the illustrated embodiment, adjacent annular-shaped structures 2101 are merged to form merged annular-shaped structures 2101. In some embodiments, the merged annular-shaped structure 2101 extends between adjacent conductive vias 1003, such that a surface of the merged annular-shaped structure 2101 facing away from the underfill material 1905 comprises concave surfaces. In some embodiments where a distance between the adjacent conductive vias 1003 is less than twice the width of the individual annular-shaped structures 2101 (measured as a difference between the outer radius and the inner radius of the annular-shaped structures 2101), the adjacent individual annular-shaped structures 2101 may touch one another and may merge to form the merged annular-shaped structures 2101.

Figure 27:
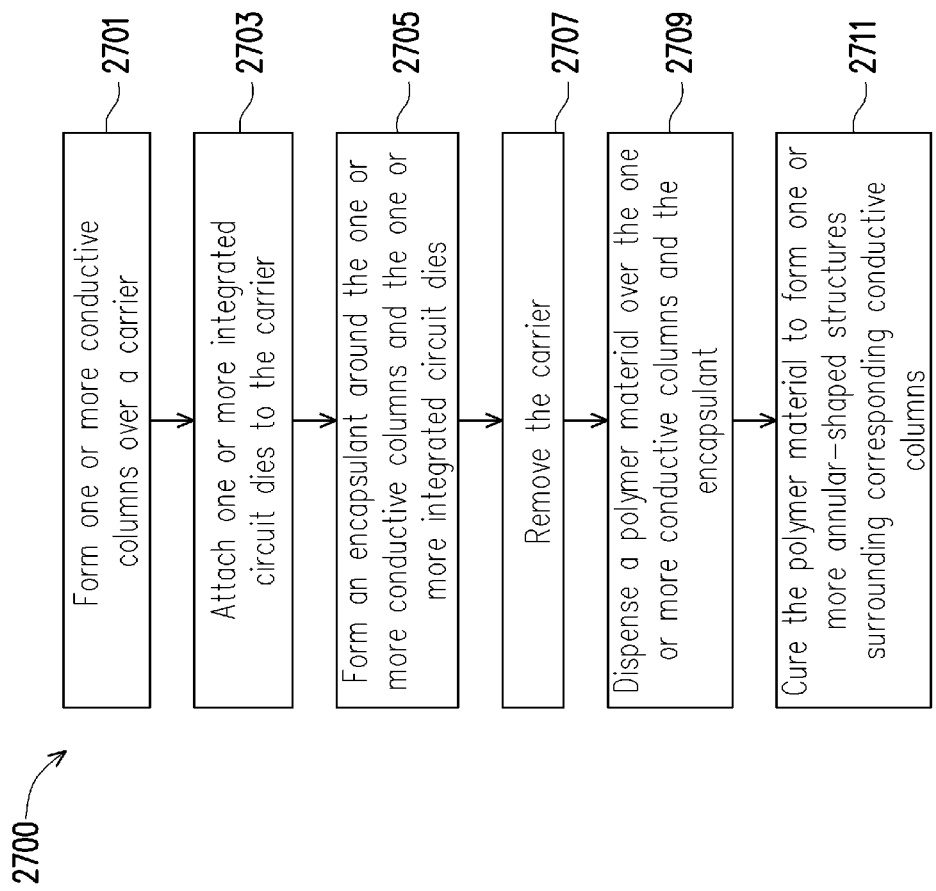
FIG. 27 is a flow diagram illustrating a method of forming an integrated circuit package in accordance with some embodiments.

FIG. 27 is a flow diagram illustrating a method 2700 of forming an integrated circuit package in accordance with some embodiments. The method 2700 starts with step 2701, where one or more conductive columns (such as the conductive vias 1003 illustrated in FIG. 11) are formed over a carrier (such as the carrier 901 illustrated in FIG. 11) as described above with reference to FIGS. 9-11. In step 2703, one or more integrated circuit dies (such as the integrated circuit dies 801 illustrated in FIG. 12) are attached to the carrier as described above with reference to FIG. 12. In step 2705, an encapsulant (such as the encapsulant 1301 illustrated in FIG. 14) is formed around the one or more conductive columns and the one or more integrated circuit dies as described above with reference to FIGS. 13 and 14. In step 2707, the carrier is removed as described above with reference to FIGS. 16A and 16B. In step 2709, a polymer material (such as the polymer material 1603 illustrated in FIGS. 16A and 16B) is dispensed over the one or more conductive columns and the encapsulant as described above with reference to FIGS. 16A and 16B. In step 2711, the polymer material is cured to form one or more annular-shaped structures (such as the annular-shaped structures 1607 illustrated in FIGS. 16A and 16B) surrounding corresponding conductive columns as described above with reference to FIGS. 16A and 16B.

Figure 28:
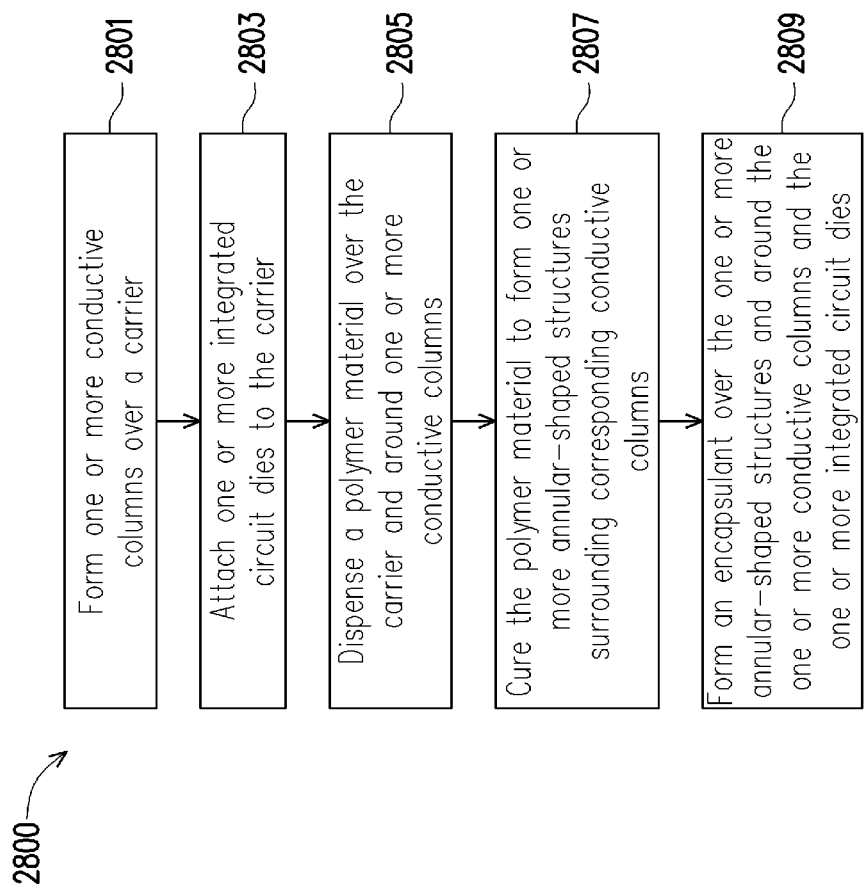
FIG. 28 is a flow diagram illustrating a method of forming an integrated circuit package in accordance with some embodiments.

FIG. 28 is a flow diagram illustrating a method 2800 of forming an integrated circuit package in accordance with some embodiments. The method 2800 starts with step 2801, where one or more conductive columns (such as the conductive vias 1003 illustrated in FIG. 21) are formed over a carrier (such as the carrier 901 illustrated in FIG. 21) as described above with reference to FIG. 21. In step 2803, one or more integrated circuit dies (such as the integrated circuit dies 801 illustrated in FIG. 21) are attached to the carrier as described above with reference to FIG. 21. In step 2805, a polymer material (such as the polymer material 1603 illustrated in FIG. 21) is dispensed over the carrier and around the one or more conductive columns as described above with reference to FIG. 21. In step 2807, the polymer material is cured to form one or more annular-shaped structures (such as the annular-shaped structures 2101 illustrated in FIG. 21) surrounding corresponding conductive columns as described above with reference to FIG. 21. In step 2809, an encapsulant (such as the encapsulant 1301 illustrated in FIG. 23) is formed over the one or more annular-shaped structures and around the one or more conductive columns and the one or more integrated circuit dies as described above with reference to FIG. 23.

In accordance to an embodiment, a method includes forming a conductive column over a carrier; attaching an integrated circuit die to the carrier, the integrated circuit die being disposed adjacent the conductive column; forming an encapsulant around the conductive column and the integrated circuit die; removing the carrier to expose a first surface of the conductive column and a second surface of the encapsulant; forming a polymer material over the first surface and the second surface; and curing the polymer material to form an annular-shaped structure, where an inner edge of the annular-shaped structure overlaps the first surface in a plan view, and where an outer edge of the annular-shaped structure overlaps the second surface in the plan view. In an embodiment, the polymer material comprises a UV curable polymer material. In an embodiment, curing the polymer material comprises exposing the polymer material to UV light. In an embodiment, the polymer material comprises a thermally curable polymer material. In an embodiment, curing the polymer material comprises performing a thermal treatment on the polymer material. In an embodiment, the method further includes, before removing the carrier, forming a redistribution structure over the conductive column, the integrated circuit die and the encapsulant, the redistribution structure being electrically coupled to the conductive column and the integrated circuit die. In an embodiment, the method further includes, before forming the polymer material, recessing the encapsulant to expose a sidewall of the conductive column. In an embodiment, at least a portion of the annular-shaped structure extends along the sidewall of the conductive column. In an embodiment, at least a portion of the conductive column is exposed through an opening in the annular-shaped structure.

In accordance to another embodiment, a method includes forming a conductive column over a carrier; attaching an integrated circuit die to the carrier, the integrated circuit die being disposed adjacent the conductive column; forming a polymer material over the carrier and around the conductive column; curing the polymer material to form an annular-shaped structure; and forming an encapsulant over the annular-shaped structure and around the conductive column and the integrated circuit die. In an embodiment, the polymer material comprises a UV curable polymer material. In an embodiment, curing the polymer material comprises exposing the polymer material to UV light. In an embodiment, the polymer material comprises a thermally curable polymer material. In an embodiment, curing the polymer material comprises performing a thermal treatment on the polymer material. In an embodiment, the method further includes forming a redistribution structure over the conductive column, the integrated circuit die and the encapsulant, the redistribution structure being electrically coupled to the conductive column and the integrated circuit die. In an embodiment, the method further includes, after forming the redistribution structure, removing the carrier to expose a first surface of the conductive column and a second surface of the annular-shaped structure. In an embodiment, the first surface is substantially level with the second surface. In an embodiment, an interface between the annular-shaped structure and the encapsulant is non-planar.

In accordance to yet another embodiment, a structure includes an integrated circuit die; an encapsulant extending along sidewalls of the integrated circuit die, the encapsulant having a first surface and a second surface opposite the first surface; a conductive column extending through the encapsulant between the first surface and the second surface; and an annular-shaped structure disposed at the first surface of the encapsulant, the annular-shaped structure surrounding the conductive column in a plan view. In an embodiment, a third surface of the conductive column is substantially level with the first surface of the encapsulant, where an inner edge of the annular-shaped structure overlaps the third surface in the plan view, and where an outer edge of the annular-shaped structure overlaps the first surface in the plan view. In an embodiment, the structure further includes a solder region extending into an opening in the annular-shaped structure, the solder region being electrically coupled to the conductive column. In an embodiment, at least a portion of the conductive column extends above the first surface of the encapsulant, and where at least a portion of the annular-shaped structure extends along a sidewall of the conductive column. In an embodiment, a third surface of the conductive column is substantially level with a fourth surface of the annular-shaped structure. In an embodiment, an interface between the annular-shaped structure and the encapsulant is non-planar.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a conductive column over a carrier;
   attaching an integrated circuit die to the carrier, the integrated circuit die being disposed adjacent the conductive column;
   forming an encapsulant around the conductive column and the integrated circuit die;
   removing the carrier to expose a first surface of the conductive column and a second surface of the encapsulant;
   forming a polymer material over and in physical contact with the first surface and the second surface; and
   curing the polymer material to form an annular-shaped structure, wherein an inner edge of the annular-shaped structure overlaps the first surface in a plan view, and wherein an outer edge of the annular-shaped structure overlaps the second surface in the plan view.

2. The method of claim 1, wherein the polymer material comprises a UV curable polymer material.

3. The method of claim 2, wherein curing the polymer material comprises exposing the polymer material to UV light.

4. The method of claim 1, wherein the polymer material comprises a thermally curable polymer material.

5. The method of claim 4, wherein curing the polymer material comprises performing a thermal treatment on the polymer material.

6. The method of claim 1, further comprising, before removing the carrier, forming a redistribution structure over the conductive column, the integrated circuit die and the encapsulant, the redistribution structure being electrically coupled to the conductive column and the integrated circuit die.

7. The method of claim 1, further comprising, before forming the polymer material, recessing the encapsulant to expose a sidewall of the conductive column.

8. A method comprising:
forming a conductive column over a carrier;
attaching an integrated circuit die to the carrier, the integrated circuit die being disposed adjacent the conductive column;
forming a polymer material over the carrier and around the conductive column, the polymer material being in physical contact with a sidewall of the conductive column;
curing the polymer material to form an annular-shaped structure; and
forming an encapsulant over the annular-shaped structure and around the conductive column and the integrated circuit die, the encapsulant being in physical contact with the sidewall of the conductive column and a sidewall of the integrated circuit die.

9. The method of claim 8, wherein the polymer material comprises a UV curable polymer material.

10. The method of claim 9, wherein curing the polymer material comprises exposing the polymer material to UV light.

11. The method of claim 8, wherein the polymer material comprises a thermally curable polymer material.

12. The method of claim 11, wherein curing the polymer material comprises performing a thermal treatment on the polymer material.

13. The method of claim 8, further comprising forming a redistribution structure over the conductive column, the integrated circuit die and the encapsulant, the redistribution structure being electrically coupled to the conductive column and the integrated circuit die.

14. The method of claim 13, further comprising, after forming the redistribution structure, removing the carrier to expose a first surface of the conductive column and a second surface of the annular-shaped structure.

15. A method comprising:
forming a first package, wherein forming the first package comprises:
forming a conductive column over a carrier;
attaching an integrated circuit die to the carrier using an adhesive, a sidewall of the integrated circuit die facing a sidewall of the conductive column;
encapsulating the conductive column and the integrated circuit die in a molding compound;
forming a redistribution structure over the conductive column, the integrated circuit die and the molding compound;
removing the carrier to expose the conductive column and the molding compound;
dispensing a polymer material at an interface between the conductive column and the molding compound, as-dispensed polymer material having an annular plan-view shape; and
curing the polymer material to form an annular-shaped structure, the annular-shaped structure overlapping the interface between the conductive column and the molding compound, the annular-shaped structure being in physical contact with the conductive column and the molding compound.

16. The method of claim 15, further comprising, before dispensing the polymer material, removing a portion of the molding compound to expose the sidewall of the conductive column.

17. The method of claim 16, wherein the annular-shaped structure extends along the sidewall of the conductive column.

18. The method of claim 16, wherein removing the portion of the molding compound further exposes the sidewall of the integrated circuit die.

19. The method of claim 15, further comprising bonding a second package to the first package using a conductive connector, the conductive connector extending through the annular-shaped structure and contacting the conductive column.

20. The method of claim 15, wherein dispensing the polymer material at the interface between the conductive column and the molding compound comprises positioning a dispensing apparatus over the interface between the conductive column and the molding compound.

* * * * *